(12) United States Patent
Atsumi et al.

(10) Patent No.: US 11,037,622 B2
(45) Date of Patent: Jun. 15, 2021

(54) SEMICONDUCTOR DEVICE AND DYNAMIC LOGIC CIRCUIT

(71) Applicant: Semiconductor Energy Laboratory Co., Ltd., Atsugi (JP)

(72) Inventors: Tomoaki Atsumi, Hadano (JP); Kiyoshi Kato, Atsugi (JP); Shuhei Maeda, Fujisawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 16/759,013

(22) PCT Filed: Nov. 12, 2018

(86) PCT No.: PCT/IB2018/058852
§ 371 (c)(1),
(2) Date: Apr. 24, 2020

(87) PCT Pub. No.: WO2019/102293
PCT Pub. Date: May 31, 2019

(65) Prior Publication Data
US 2020/0265887 A1    Aug. 20, 2020

(30) Foreign Application Priority Data
Nov. 24, 2017  (JP) .............................. JP2017-225312
Sep. 11, 2018  (JP) .............................. JP2018-169677

(51) Int. Cl.
*G11C 11/00*    (2006.01)
*G11C 11/4094*  (2006.01)
(Continued)

(52) U.S. Cl.
CPC ........ *G11C 11/4094* (2013.01); *H01L 27/108* (2013.01); *H01L 29/7869* (2013.01)

(58) Field of Classification Search
CPC ............... G11C 11/4094; H01L 27/108; H01L 29/7869; H01L 29/78648; H01L 27/1225; H01L 27/1156
See application file for complete search history.

(56) References Cited

U.S. PATENT DOCUMENTS 4,570,242 A     2/1986  Nagami
5,434,816 A *   7/1995  Levi ...................... G11C 11/403
                                                        365/149
(Continued)

FOREIGN PATENT DOCUMENTS

DE    102016211938    1/2017
GB    2111777         7/1983
(Continued)

OTHER PUBLICATIONS

Onuki.T et al., "Embedded Memory and ARM Cortex-M0 Core Using 60-nm C-Axis Aligned Crystalline Indium.Gallium.Zinc Oxide FET Integrated With 65-nm Si CMOS", IEEE Journal of Solid-State Circuits, Apr. 1, 2017, vol. 52, No. 4, pp. 925-932.
(Continued)

*Primary Examiner* — Uyen Smet
(74) *Attorney, Agent, or Firm* — Robinson Intellectual Property Law Office; Eric J. Robinson

(57) ABSTRACT

A semiconductor device whose operating speed is increased is provided. The semiconductor device includes a write word line, a read word line, a write bit line, a read bit line, a first wiring, and a memory cell. The memory cell includes three transistors of a single conductivity type and a capacitor. Gates of the three transistors are electrically connected to the write word line, a first terminal of the capacitor, and the read word line, respectively. A second terminal of the capacitor is electrically connected to the read bit line. A source and a drain of one transistor are electrically connected to the write bit line and the gate of another transistor, respectively. Two
(Continued)

of the three transistors are electrically connected in series between the read bit line and the first wiring. A channel formation region of each of the three transistors includes, for example, a metal oxide layer.

22 Claims, 18 Drawing Sheets

(51) Int. Cl.
*H01L 27/108* (2006.01)
*H01L 29/786* (2006.01)

(56) References Cited

U.S. PATENT DOCUMENTS

| | | | |
|---|---|---|---|
| 6,204,723 B1* | 3/2001 | Houghton | G11C 11/4074 327/540 |
| 2012/0275214 A1 | 11/2012 | Atsumi et al. | |
| 2013/0069132 A1 | 3/2013 | Atsumi et al. | |
| 2013/0135185 A1 | 5/2013 | Nagatsuka et al. | |
| 2015/0255139 A1 | 9/2015 | Atsumi et al. | |
| 2015/0270270 A1 | 9/2015 | Kato | |
| 2016/0099258 A1 | 4/2016 | Yoneda | |
| 2016/0155480 A1* | 6/2016 | Inoue | H01L 27/0688 365/72 |
| 2017/0005659 A1 | 1/2017 | Tamura | |

FOREIGN PATENT DOCUMENTS

| | | |
|---|---|---|
| JP | 58-073096 A | 5/1983 |
| JP | 2015-195076 A | 11/2015 |
| JP | 2016-076285 A | 5/2016 |
| JP | 2017-017693 A | 1/2017 |
| KR | 2017-0003420 A | 1/2017 |
| WO | WO-2016/055894 | 4/2016 |

OTHER PUBLICATIONS

Ishizu.T et al., "A 140 MHz 1 Mbit 2T1C Gain-Cell Memory with 60-nm Indium-Gallium-Zinc Oxide Transistor Embedded into 65-nm CMOS Logic Process Technology", 2017 Symposium on VLSI Circuits Digest of Technical Papers, Jun. 5, 2017, pp. 162-163.
International Search Report (Application No. PCT/IB2018/058852) dated Feb. 5, 2019.
Written Opinion (Application No. PCT/IB2018/058852) dated Feb. 5, 2019.

* cited by examiner time (100ns/div)

| Technology | 60 nm OS transistor |
|---|---|
| Organization | 1 kbit (32 rows × 32 columns) |
| Cell size | 1.98 μm × 1.95 μm |
| Supply voltage | VDDM : 3.3V |
| | VH (Control signal high voltage) : 5.0 V |
| Frequency | 18 MHz |
| Active power | Write : 97.9 μW / MHz |
| | Read : 258.6 μW / MHz |
| Static power | 9.9 nW in standby state |
| Endurance | $10^{14}$ Cycles |

SEMICONDUCTOR DEVICE AND DYNAMIC LOGIC CIRCUIT

TECHNICAL FIELD

One embodiment of the invention disclosed in the specification of this application relates to a semiconductor device, its operation method, its usage method, its manufacturing method, and the like. Note that one embodiment of the present invention is not limited to the technical field described as an example.

In this specification, a semiconductor device refers to a device that utilizes semiconductor characteristics, and means a circuit including a semiconductor element (e.g., a transistor, a diode, or a photodiode), a device including the circuit, or the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves might be semiconductor devices, or might each include a semiconductor device.

BACKGROUND ART

A transistor including a metal oxide in a channel formation region (hereinafter, such a transistor may be referred to as a metal oxide transistor, an oxide semiconductor transistor, or an OS transistor) is known. For example, in the embedded memory device described in Non-Patent Document 1, an OS transistor is used as a write transistor of a 1T1C (one transistor one capacitor) cell. In the memory device described in Non-Patent Document 2, an OS transistor is used as a write transistor of a 2T1C gain cell and a Si transistor is used as a read transistor.

Note that in this specification, a memory device like that in each of Non-Patent Documents 1 and 2, whose memory cell includes an OS transistor, is sometimes referred to as an OS memory device.

Logic circuits can be classified into static logic circuits, dynamic logic circuits, pseudo logic circuits, and the like. Dynamic logic circuits operate by retaining data in dynamic nodes temporarily; thus, leakage current from transistors causes severer problems in dynamic logic circuits than in static logic circuits. For example, Patent Document 1 discloses a technique that uses an OS transistor to inhibit a voltage drop in a dynamic node.

REFERENCE

Patent Document

[Patent Document 1] Japanese Published Patent Application No. 2017-017693

Non-Patent Document

[Non-Patent Document 1] T. Onuki et al., "Embedded Memory and ARM Cortex-M0 Core Using 60-nm C-Axis Aligned Crystalline Indium-Gallium-Zinc Oxide FET Integrated With 65-nm Si CMOS", IEEE J. Solid-State Circuits, Vol. 52, No. 4, pp. 925-932, 2017.
[Non-Patent Document 2] T. Ishizu et al., "A 140 MHz 1 Mbit 2T1C Gain-Cell Memory with 60-nm Indium-Gallium-Zinc Oxide Transistor Embedded into 65-nm CMOS Logic Process Technology", Symp. VLSI Circuits Dig. Tech. Papers, pp. 162-163, 2017.

DISCLOSURE OF INVENTION

An object of one embodiment of the present invention is to provide a novel semiconductor device including transistors of a single conductivity type and its operation method, to reduce the number of transistors in a semiconductor device, to increase the operating speed of a semiconductor device, to reduce the power consumption of a semiconductor device, or to achieve high rewrite endurance of a semiconductor device.

One embodiment of the present invention does not necessarily achieve all the objects. The description of a plurality of objects does not disturb the existence of each object. Other objects will be apparent from the description in this specification, and such objects could be objects of one embodiment of the present invention.

(1) One embodiment of the present invention is a semiconductor device that includes a write word line, a read word line, a write bit line, a read bit line, a first wiring, and a memory cell. The memory cell includes first, second, and third transistors of a single conductivity type and a capacitor. Gates of the first, second, and third transistors are electrically connected to the write word line, a first terminal of the capacitor, and the read word line, respectively. A second terminal of the capacitor is electrically connected to the read bit line. One of a source and a drain of the first transistor is electrically connected to the write bit line. The other of the source and the drain of the first transistor is electrically connected to the gate of the second transistor. The second transistor and the third transistor are electrically connected in series between the read bit line and the first wiring.

(2) In the above embodiment (1), the first to third transistors each include a back gate and first to third voltages are respectively input to the back gates of the first to third transistors.

(3) One embodiment of the present invention is a dynamic logic circuit that includes an input node, first to fourth wirings, and first to fourth transistors of a single conductivity type. A first signal is input to a gate of the first transistor. A source and a drain of the first transistor are electrically connected to the first wiring and the input node, respectively. The second to fourth transistors are electrically connected in series between the second wiring and the third wiring. A second signal is input to a gate of the second transistor. An inverted signal of the second signal is input to a gate of the fourth transistor. A gate of the third transistor is electrically connected to the input node. The third transistor includes a back gate, which is electrically connected to the fourth wiring.

(4) One embodiment of the present invention is a dynamic logic circuit that includes an input node, a first dynamic node, a second dynamic node, and first to sixth transistors of a single conductivity type. Drains of the first to third transistors are electrically connected to the first dynamic node. Drains of the fourth to sixth transistors are electrically connected to the second dynamic node. Sources of the first and fourth transistors are electrically connected to the input node. A first voltage is input to sources of the second, third, fifth, and sixth transistors. A first signal is input to gates of the first and sixth transistors. A second signal is input to gates of the fourth and third transistors. A third signal is input to gates of the second and fifth transistors.

(5) One embodiment of the present invention is a buffer circuit that includes a first input node, a second input node, an output node, a first capacitor, a second capacitor, and first to sixth transistors of a single conductivity type. The first input node is electrically connected to a first terminal of the first capacitor. The second input node is electrically connected to a first terminal of the second capacitor. A source of the first transistor, a drain of the second transistor, and a gate of the third transistor are electrically connected to a second terminal of the first capacitor. A source of the fourth transistor, a drain of the fifth transistor, and a gate of the sixth transistor are electrically connected to a second terminal of the second capacitor. A source of the third transistor and a drain of the sixth transistor are electrically connected to the output node.

In this specification, ordinal numbers such as "first", "second", and "third" are used to show the order in some cases. Alternatively, ordinal numbers are used to avoid confusion among components in some cases. In such a case, the ordinal numbers do not limit the number of the components. For example, it is possible to replace the term "first" with the term "second" or "third" in describing one embodiment of the present invention.

In this specification, when it is described that X and Y are connected, the case where X and Y are electrically connected, the case where X and Y are functionally connected, and the case where X and Y are directly connected are included therein. Accordingly, the connection is not limited to a predetermined connection relationship, e.g., a connection relationship shown in drawings or texts, and connection relationships other than those shown in the drawings or the texts are deemed to be also disclosed in the drawings or the texts. Each of X and Y denotes an object (e.g., a device, an element, a circuit, a wiring, an electrode, a terminal, a conductive film, or a layer).

A transistor includes at least three terminals: a gate, a source, and a drain. The transistor further includes a back gate in some cases. The gate is a control terminal for controlling the on/off state of the transistor. Two terminals functioning as a source and a drain are input/output terminals of the transistor. Functions of the two input/output terminals depend on the conductivity type (n-channel type or p-channel type) of the transistor and the levels of potentials applied to the three terminals of the transistor, and one of the two terminals functions as a source and the other functions as a drain. Therefore, the terms "source" and "drain" can be switched in this specification. In this specification, the two terminals other than the gate are sometimes referred to as a first terminal and a second terminal, for example.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

A voltage usually refers to a potential difference between a given potential and a reference potential (e.g., a ground potential (GND) or a source potential). Thus, a voltage can also be referred to as a potential. Note that a potential is relative; therefore, GND does not necessarily mean 0 V.

In this specification, terms for describing arrangement, such as "over", "above", "under", and "below" are used for convenience to describe the positional relationship between components with reference to drawings in some cases. Furthermore, the positional relationship between components changes as appropriate in accordance with the direction in which each component is described. Thus, there is no limitation on terms used in this specification, and the terms can be changed appropriately depending on the situation.

In this specification, the terms "film" and "layer" can be interchanged with each other, depending on circumstances or conditions. For example, the term "conductive layer" can be changed into the term "conductive film" in some cases. The term "insulating film" can be changed into the term "insulating layer" in some cases, for example.

According to one embodiment of the present invention, a novel semiconductor device including transistors of a single conductivity type and its operation method can be provided, the number of transistors in a semiconductor device can be reduced, the operating speed of a semiconductor device can be increased, the power consumption of a semiconductor device can be reduced, or high rewrite endurance of a semiconductor device can be achieved.

The description of a plurality of effects does not disturb the existence of other effects. One embodiment of the present invention does not need to have all the effects described above. In one embodiment of the present invention, other objects, effects, and novel features will be apparent from the description in the specification and the drawings.

BEST MODE FOR CARRYING OUT THE INVENTION

Figure 1A:
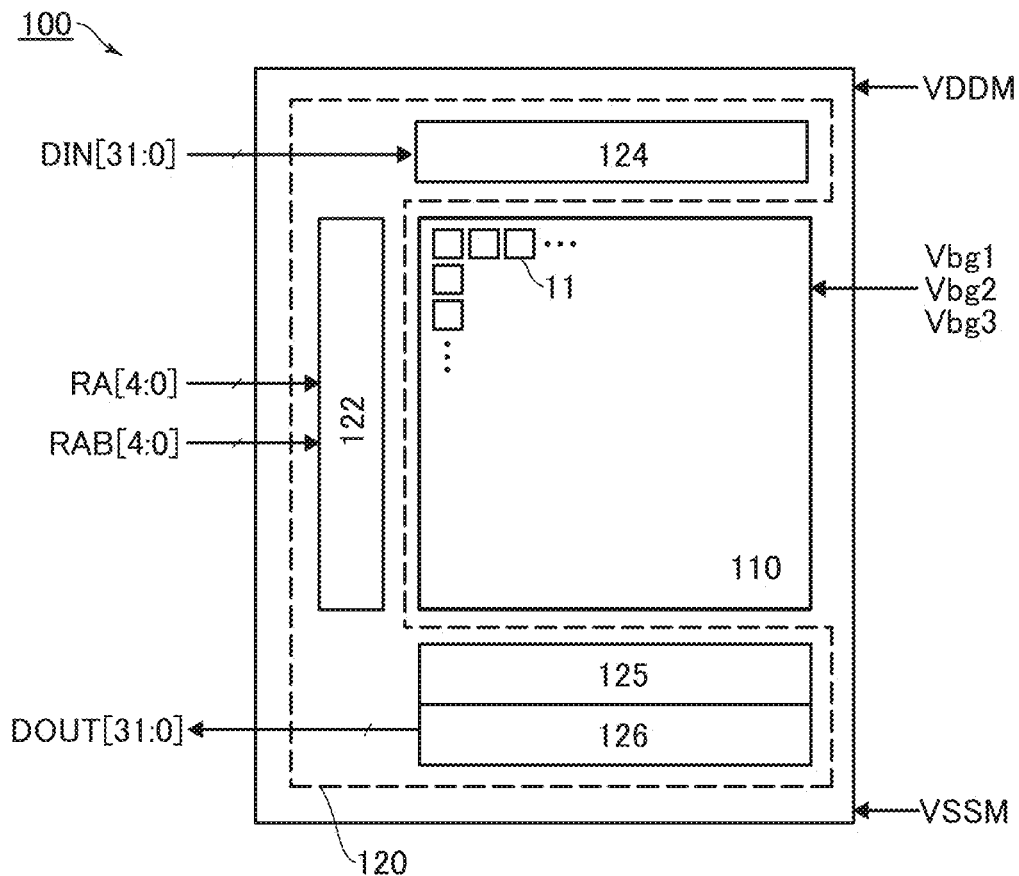
FIG. 1A is a block diagram illustrating a configuration example of a memory device and FIG. 1B is a circuit diagram illustrating a configuration example of a memory cell.

Embodiments of the present invention will be described below. Note that one embodiment of the present invention is not limited to the following description. It will be readily appreciated by those skilled in the art that modes and details of the present invention can be modified in various ways without departing from the spirit and scope of the present invention. One embodiment of the present invention therefore should not be construed as being limited to the description of the following embodiments and examples.

Some of the embodiments and examples described below can be combined as appropriate. In addition, in the case where a plurality of structure examples (including a manufacturing method example, an operating method example, a usage method example, and the like) are given in one embodiment, some of the structure examples can be combined as appropriate, and any of the structure examples can be combined with one or more structure examples described in the other embodiments.

In the drawings, the size, the layer thickness, or the region is exaggerated for clarity in some cases. Thus, embodiments of the present invention are not limited to such scales. The drawings are schematic views showing ideal examples, and embodiments of the present invention are not limited to shapes, values, or the like shown in the drawings. For example, the following can be included: variation in signal, voltage, or current due to noise or difference in timing.

Embodiment 1

As an example of a semiconductor device, a memory device including OS transistors is described. A memory device 100 illustrated in FIG. 1A includes a memory cell array 110 and a peripheral circuit 120. Voltages VDDM, VSSM, Vbg1, Vbg2, and Vbg3 and other voltages are input to the memory device 100. The voltages VDDM and VSSM are respectively a high power supply voltage and a low power supply voltage. The voltage VSSM is a ground potential (GND), for example.

The memory cell array 110 and the peripheral circuit 120 include OS transistors. The memory cell array 110 includes a plurality of memory cells 11. In this example, the memory cells 11 are arranged in 32 rows and 32 columns. The peripheral circuit 120 includes a row decoder 122, a write circuit 124, a read circuit 125, and an output circuit 126. Data DIN[31:0], address signals RA[4:0], address signals RAB[4:0], and various control signals are input to the peripheral circuit 120. In this example, the memory width of the memory device 100 is 32 bits and the data DIN[31:0] and data DOUT[31:0] are respectively write data and read data.

Examples of a metal oxide that can be used for an OS transistor include a Zn oxide, a Zn—Sn oxide, a Ga—Sn oxide, an In—Ga oxide, an In—Zn oxide, and an In-M-Zn oxide (M is Ti, Ga, Y, Zr, La, Ce, Nd, Sn, or Hf). It is also possible to use an oxide containing indium, zinc, and one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like. In this specification, a metal oxynitride such as an In—M—Zn oxynitride is included in the category of a metal oxide.

To improve the reliability and electrical characteristics of an OS transistor, a metal oxide with a crystal part such as a CAAC-OS or an nc-OS is preferably used. CAAC-OS stands for c-axis-aligned crystalline oxide semiconductor. The CAAC-OS has c-axis alignment, its nanocrystals are connected in the a-b plane direction, and its crystal structure has distortion. Note that distortion refers to a portion where the direction of lattice arrangement changes between a region with uniform lattice arrangement and another region with uniform lattice arrangement in a region where the nanocrystals are connected. Nc-OS stands for nanocrystalline oxide semiconductor.

A metal oxide has a wide band gap (e.g., 2.5 eV or more) and thus, an OS transistor has an extremely low off-state current. For example, the off-state current per micrometer of channel width at room temperature (25° C.) and at a source-drain voltage of 3.5 V can be lower than $1 \times 10^{-20}$ A, lower than $1 \times 10^{-22}$ A, or lower than $1 \times 10^{-24}$ A. Such an extremely low off-state current enables the on/off ratio of drain current to be more than or equal to 20 digits and less than or equal to 150 digits. In a memory element using an OS transistor, accordingly, the amount of electric charges that leak from a retention node through the OS transistor is extremely small; thus, the memory element can be used as a nonvolatile memory element.

Avalanche breakdown or the like is less likely to occur in some cases in an OS transistor than in a general Si transistor because, for example, a metal oxide has a wide band gap and thus electrons are less likely to be excited, and the effective mass of a hole is large. Therefore, for example, it may be possible to inhibit hot-carrier degradation or the like due to avalanche breakdown. Since hot-carrier degradation can be inhibited, an OS transistor can be driven with a high drain voltage.

An OS transistor is an accumulation transistor in which electrons are majority carriers. Therefore, drain-induced barrier lowering (DIBL), which is a short-channel effect, is less likely to occur in an OS transistor than in an inversion transistor having a PN junction, typically a Si transistor. In other words, an OS transistor has higher resistance against a short channel effect than a Si transistor.

Owing to its high resistance against a short channel effect, an OS transistor can have a reduced channel length without compromising reliability, which means that the use of an OS transistor increases the degree of integration in a circuit. Although a reduction in channel length enhances a drain electric field, avalanche breakdown is less likely to occur in an OS transistor than in a Si transistor as described above.

Owing to its high resistance against a short channel effect, an OS transistor can have a thicker gate insulating layer than a Si transistor. For example, even a minute OS transistor whose channel length and channel width are 50 nm or less can be provided with a gate insulating layer as thick as about 10 nm in some cases. A thick gate insulating layer can reduce gate parasitic capacitance and thus can increase the operating speed of a circuit. Gate leakage current decreases, whereby static power consumption can be reduced.

<<Memory Cell>>

Figure 1B:
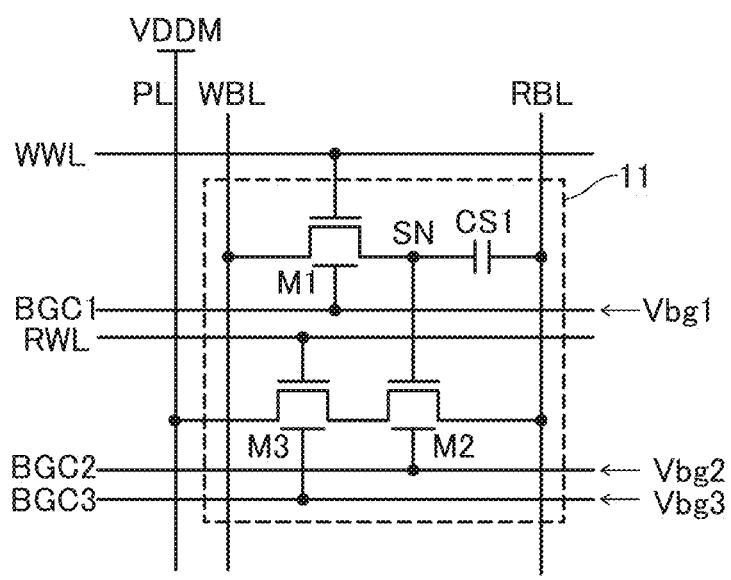

As illustrated in FIG. 1B, the memory cell 11 is electrically connected to a write word line WWL, a read word line RWL, a write bit line WBL, a read bit line RBL, and wirings PL, BGC1, BGC2, and BGC3. For example, the voltages VDDM, Vbg1, Vbg2, and Vbg3 are respectively input to the wirings PL, BGC1, BGC2, and BGC3.

The memory cell 11 is a 3T1C gain cell that includes transistors M1, M2, and M3, a capacitor CS1, and a node SN. The transistors M1, M2, and M3 are a write transistor, a read transistor, and a selection transistor, respectively. The node SN is a retention node.

A gate, a source, a drain, and a back gate of the transistor M1 are electrically connected to the write word line WWL, the node SN, the write bit line WBL, and the wiring BGC1, respectively. A gate, a source, a drain, and a back gate of the transistor M2 are electrically connected to the node SN, the read bit line RBL, a source of the transistor M3, and the wiring BGC2, respectively. A gate, a drain, and a back gate of the transistor M3 are electrically connected to the read word line RWL, the wiring PL, and the wiring BGC3, respectively. A first terminal and a second terminal of the capacitor CS1 are electrically connected to the node SN and the read bit line RBL, respectively.

Data is written when the node SN is charged and discharged, and the data is read when the transistor M3 is turned on. Thus, the memory cell 11 does not have a limit on the number of times of data rewriting in principle, can perform data writing and data reading with low energy, and does not consume power in retaining data. The transistor M1 is an OS transistor with an extremely low off-state current, so that the memory cell 11 has excellent data retention characteristics.

When the voltages Vbg1, Vbg2, and Vbg3 are input to the back gates of the transistors M1, M2, and M3, respectively, the threshold voltages (hereinafter sometimes referred to as "Vt") of the transistors M1, M2, and M3 can be individually set. It is preferable that at least the transistor M2 have a back gate. As described later, when the Vt of the transistor M2 is shifted to the negative voltage side with the use of the voltage Vbg2, excellent data retention characteristics and high-speed reading are achieved.

<<Memory Cell Array>>

Figure 2:
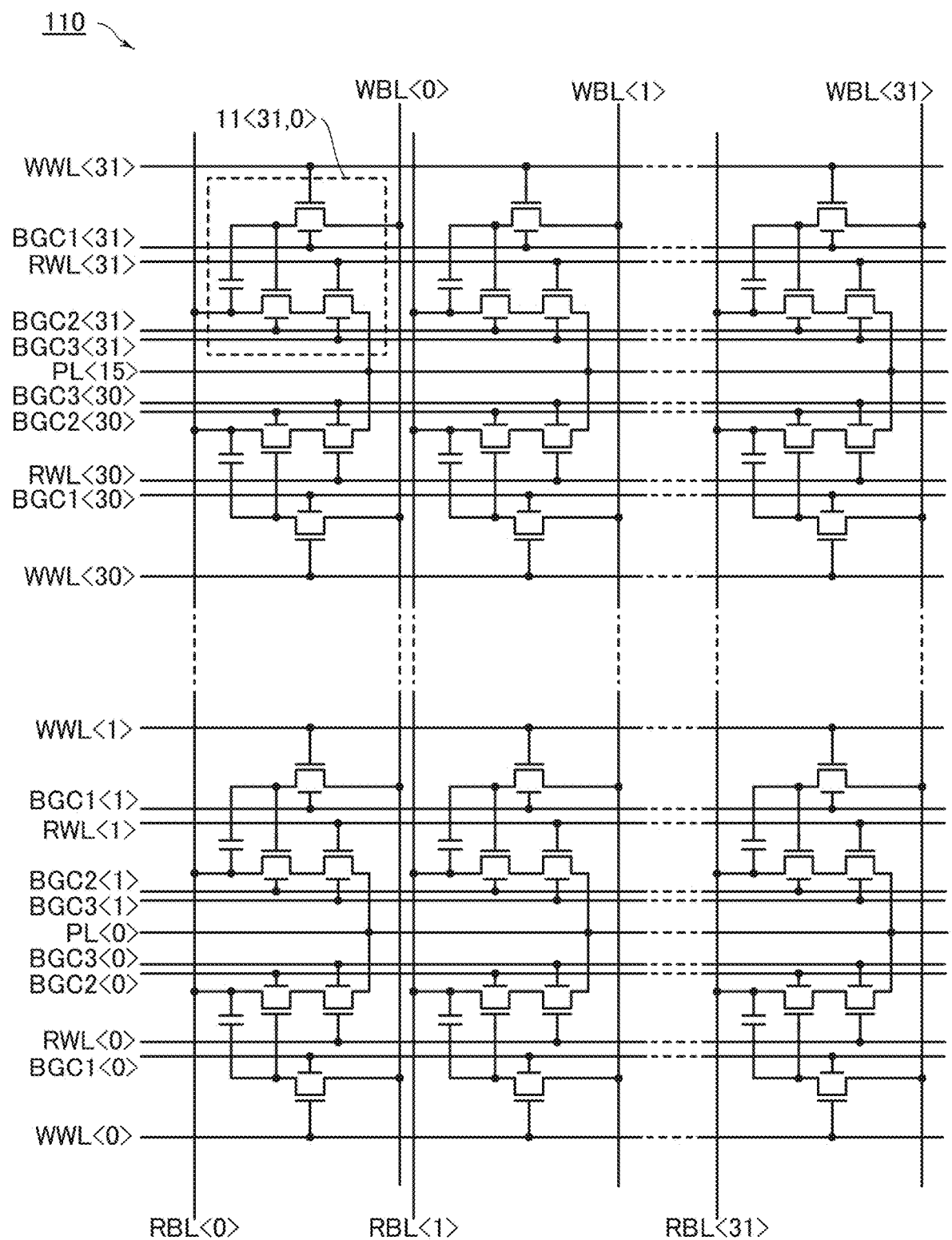
FIG. 2 is a circuit diagram illustrating a configuration example of a memory cell array.

FIG. 2 shows a circuit configuration example of the memory cell array 110. Adjacent two rows share one wiring PL. Note that in the memory cell array 110, adjacent two columns may share one wiring PL, for example. Adjacent two rows may share some or all of the wirings BGC1 to BGC3.

In this specification, to specify any one of a plurality of read bit lines RBL, the one read bit line is referred to as a "read bit line RBL<0>", for example. The "read bit line RBL" represents a given read bit line RBL. The same applies to other elements. For example, the "read bit line RBL<0>" represents a read bit line in the 0-th row, and a "memory cell 11<31,0>" represents the memory cell 11 in the 31-th row and the 0-th column. To distinguish an element of one memory cell 11 from that of another memory cell 11, a reference numeral accompanying a row number and a column number is used in some cases. For example, a "transistor M1<0,0>" represents the transistor M1 of a memory cell 11<0,0>.

<<Peripheral Circuit>>

The peripheral circuit 120 includes transistors of a single conductivity type (here, n-channel transistors). The conductivity type of silicon can be easily controlled by using an impurity introduction technique. In contrast, the conductivity type of a metal oxide semiconductor is very difficult to control. For example, a metal oxide containing indium (e.g., In oxide) and a metal oxide containing zinc (e.g., Zn oxide) that are n-type semiconductors have been manufactured but those that are p-type semiconductors have not yet been manufactured. Complementary logic circuits (also referred to as CMOS logic circuits) on a practical level using only OS transistors have not yet been manufactured. Thus, the peripheral circuit 120 includes not a complementary logic circuit but a logic circuit including transistors of a single conductivity type (here, n-channel transistors). Note that in this specification, a circuit including transistors of a single conductivity type is sometimes referred to as a "single-conductivity-type circuit".

The peripheral circuit 120 includes a dynamic logic circuit. In a dynamic logic circuit, the voltage of a dynamic node needs to be retained during an evaluation period. In a dynamic logic circuit using Si transistors, the insufficient off-state characteristics of the Si transistors prevent retention of the voltage of a dynamic node if the operation frequency is too low or a clock signal is stopped. In a dynamic logic circuit using OS transistors (hereinafter sometimes referred to as an "OS dynamic logic circuit"), in contrast, leakage of electric charges from a dynamic node can be minimized owing to an extremely low off-state current of an OS transistor. In other words, the frequency of clock signals does not need to be higher than necessary and thus, dynamic power consumption can be low. Besides, clock gating and power gating are possible. Such features of an OS dynamic logic circuit will be specifically described in Example 1.

In general, a dynamic logic circuit requires a smaller number of transistors than a static logic circuit. An OS dynamic logic circuit does not need to be provided with a circuit for retaining the voltage of a dynamic node (e.g., a keeper circuit). Accordingly, the use of an OS dynamic logic circuit for the peripheral circuit 120 can reduce the area of the memory device 100.

A specific configuration of the peripheral circuit 120 will be described below with reference to FIG. 3, FIG. 4, FIG. 5, FIG. 6A, FIG. 6B, FIG. 7, FIG. 8, and FIG. 9.

<Row Decoder 122>

Figure 3:
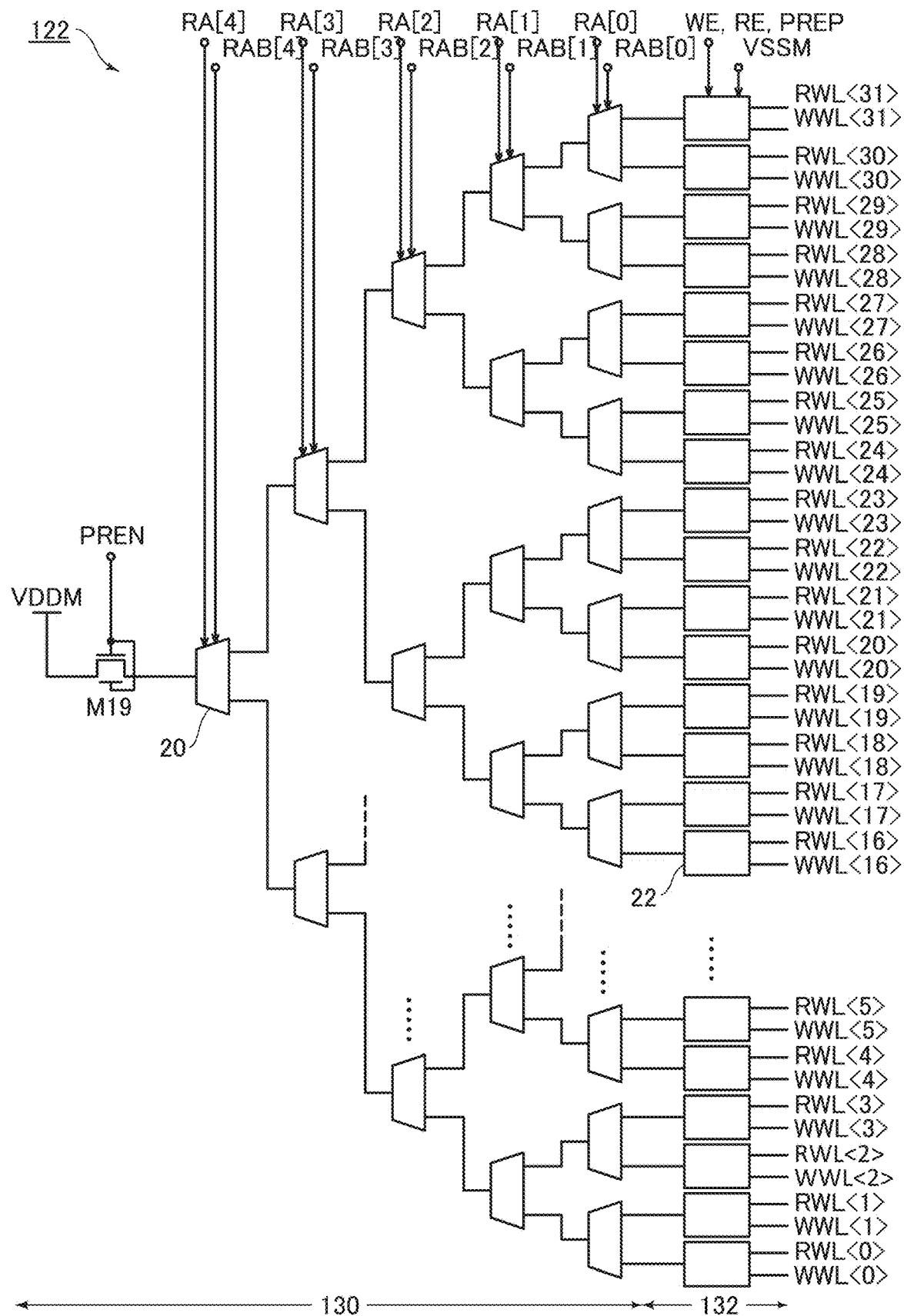
FIG. 3 is a circuit diagram illustrating a configuration example of a row decoder.

As illustrated in FIG. 3, the voltages VDDM and VSSM, the address signals RA[4:0], the address signals RAB[4:0], and signals WE, RE, PREN, and PREP are input to the row decoder 122.

The signal WE and the signal RE are respectively a write enable signal and a read enable signal. The signals WE and RE determine the state of the memory device 100. When both the signal WE and the signal RE are "L" (low level), the memory device 100 is in a standby state. The memory device 100 performs data writing when the signal WE is "H" (high level) and performs data reading when the signal RE is "H".

The signal PREP and the signal PREN are inverses of each other. In the OS dynamic logic circuit, the signals PREN and PREP function as clock signals that control precharging or predischarging of a dynamic node.

The row decoder 122 includes a decoder 130 and a word line driver 132. The decoder 130 has a function of decoding the address signals RA[4:0] and the address signals RAB[4:0] to specify the row that is to be accessed. The word line driver 132 has a function of selecting (or "asserting") the write word line WWL or the read word line RWL in the row specified by the decoder 130.

(Decoder 130)

The decoder 130 is formed of a precharge pass transistor logic circuit and includes a transistor M19 and a plurality of circuits 20. The plurality of circuits 20 are arranged to construct a perfect binary tree structure with a height of 4, and the number of the circuits 20 is $31(=2^5-1)$. The transistor M19 is provided between an input node of the circuit 20 provided at the root of the binary tree structure and a power supply line for the voltage VDDM. The signal PREN is input to a gate of the transistor M19. The transistor M19 functions as a pull-up circuit. The signal PREN functions as an enable signal for the decoder 130.

Note that in this specification, the power supply line for the voltage VDDM is sometimes referred as a "VDDM line". The same applies to other power supply lines in some cases.

The word line driver 132 includes 32 circuits 22. The circuits 22 are electrically connected to the circuits 20 provided at leaves of the binary tree structure. The two output nodes of the circuit 22<j> (j is an integer from 0 to 31) are electrically connected to the write word line WWL<j> and the read word line RWL<j>.

Figure 4:
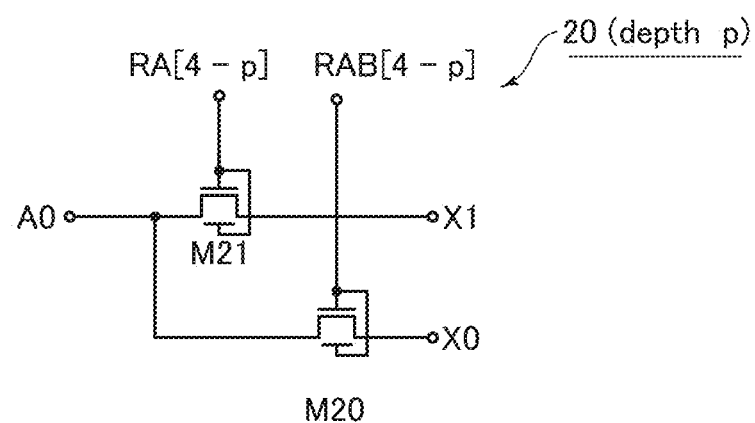
FIG. 4 is a circuit diagram illustrating a configuration example of a decoder.

FIG. 4 illustrates a configuration example of the circuit 20 at a depth of p (p is an integer from 0 to 4). The circuit 20 is a pass transistor logic circuit including a transistor M20 and a transistor M21. In the circuit 20, a node A0 is an input node and a node X1 and a node X0 are output nodes. Address signals RA[4−p] and RAB[4−p] are input to gates of the transistors M20 and M21, respectively.

The circuit 20 functions as a one input-two output demultiplexer. The node A0 and the node X1 are electrically connected when the address signal RA[4−p] is "H" (="1"), and the node A0 and the node X0 are electrically connected when the address signal RA[4−p] is "L" (="0").

In the transistor M19, a back gate and the gate are connected. Thus, the Vt of the transistor M19 dynamically changes. When the transistor M19 is on, a positive voltage which is the same as a positive voltage input to the gate is input to the back gate, and the Vt of the transistor M19 is shifted to the negative voltage side, whereby the current drive capability of the transistor M19 is improved. Therefore, a reduction in output voltage due to Vt (hereinafter sometimes referred to as "Vt drop") can be inhibited. In a similar manner, the Vt of each of the transistors M20 and M21 also dynamically changes.

Six OS transistors are electrically connected in series to the node A0 of the circuit 20 in the final stage. The back gate and the gate of each OS transistor are electrically connected to each other, whereby the operating speed of the decoder 130 can be increased and the voltage drop of the output node can be inhibited.

(Word Line Driver 132)

Figure 5:
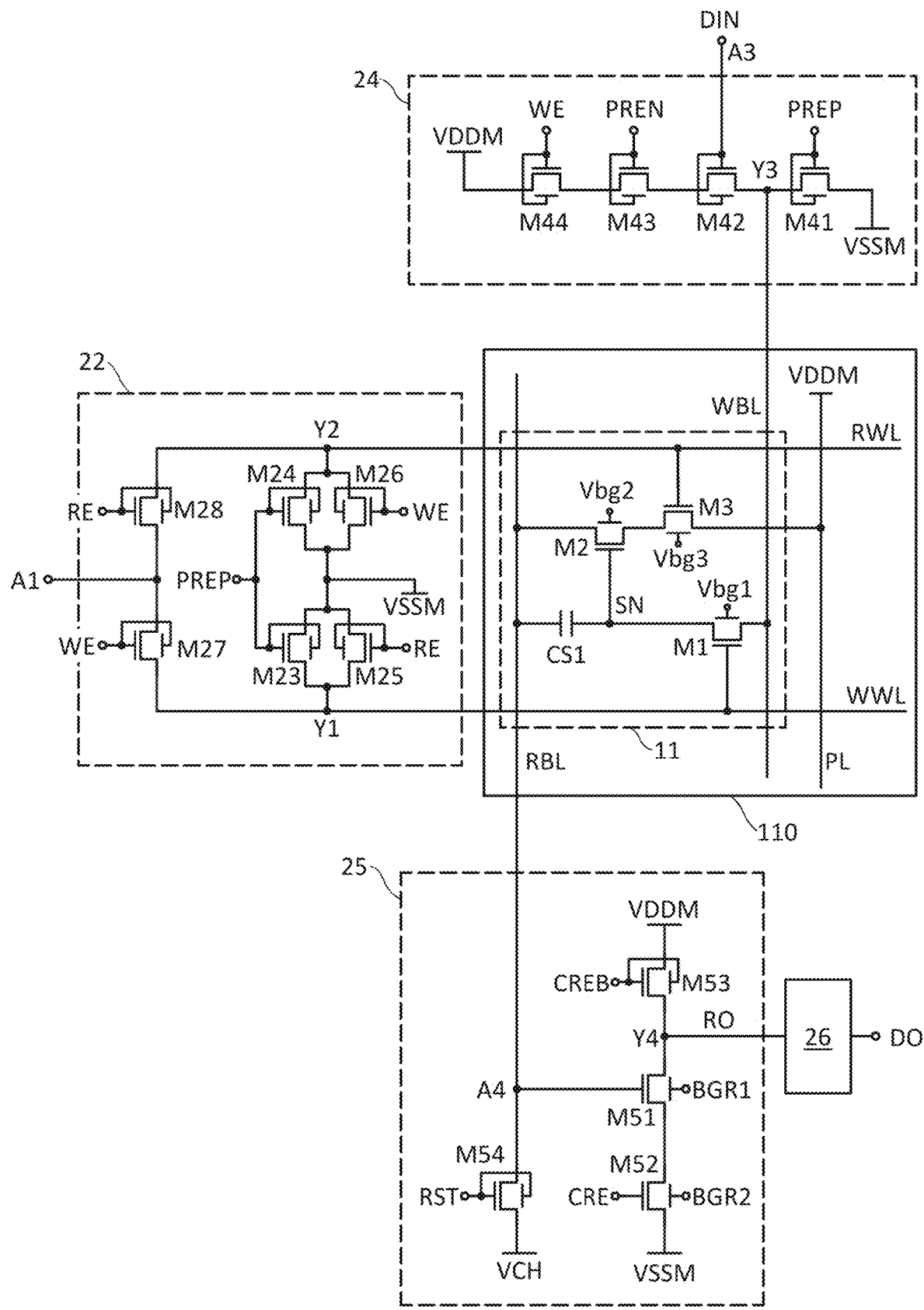
FIG. 5 is a circuit diagram illustrating a configuration example of a peripheral circuit.

As illustrated in FIG. 5, the circuit 22 is a discharge dynamic logic circuit that includes transistors M23, M24, M25, M26, M27, and M28 and nodes A1, Y1, and Y2. The node A1 is an input node that is electrically connected to the node X0 or X1 of the circuit 20 in the final stage. The nodes Y1 and Y2 are dynamic nodes, to which, respectively, the write word line WWL and the read word line RWL are electrically connected.

The signal PREP is input to gates of the transistors M23 and M24, the signal RE is input to gates of the transistors M25 and M28, and the signal WE is input to gates of the transistors M26 and M27. In each of the transistors M23 to M28, a back gate is electrically connected to the gate. When the circuit 22 includes OS transistors in each of which the back gate and the gate are electrically connected, the operating speed can be increased without input of a voltage for controlling Vt from the outside.

The transistors M23 and M25 are electrically connected in parallel between the node Y1 and a power supply line for the voltage VSSM (hereinafter referred to as "VSSM line"). The transistors M24 and M26 are electrically connected in parallel between the node Y2 and the VSSM line. The transistor M27 controls electrical connection between the node A1 and the node Y1 and the transistor M28 controls electrical connection between the node A1 and the node Y2.

The period in which the signal PREP is "H" is a discharge period, and the period in which the signal PREP is "L" is an evaluation period. During the discharge period, the voltages of the nodes Y1 and Y2 are initialized to "L". Specifically, the transistors M23 and M24 are on and thus, the voltage VSSM is input to the nodes Y1 and Y2. Therefore, the write word line WWL and the read word line RWL are in a non-selected state in the discharge period.

The signals WE and RE function as enable signals for the circuit 22. In the evaluation period, the circuit 22 becomes active when the signal WE or RE becomes "H", and the logic of the node Y1 or the node Y2 is determined depending on that of the node A1. Specifically, when the signal WE is "H", whether the write word line WWL is in a selected state or a non-selected state is determined. When the signal RE is "H", whether the read word line RWL is in a selected state or a non-selected state is determined.

When the signal WE is "H", the voltage VSSM is input to the read word line RWL and thus, the read word line RWL remains in a non-selected state. The write word line WWL is electrically connected to the node A1; thus, the write word line WWL becomes a selected state when the voltage of the node A1 is "H" and remains in a non-selected state when the voltage of the node A1 is "L". When the signal RE is "H", the voltage VSSM is input to the write word line WWL and thus, the write word line WWL remains in a non-selected state. The read word line RWL is electrically connected to the node A1; thus, the read word line RWL becomes a selected state when the voltage of the node A1 is "H" and remains in a non-selected state when the voltage of the node A1 is "L".

<Write Circuit 124>

In the write circuit 124, a circuit 24 illustrated in FIG. 5 is provided for each write bit line WBL. The circuit 24 includes a node A3, a node Y3, a transistor M41, a transistor M42, a transistor M43, and a transistor M44.

The nodes A3 and Y3 are respectively an input node and an output node. In the circuit 24<i> (i is an integer from 0 to 31), the data DIN[i] is input to the node A3, and the node Y3 is electrically connected to the write bit line WBL<i>.

The transistors M41 to M44 are electrically connected in series between the VSSM line and the VDDM line. A gate of the transistor M42 is the node A3, and the connection node between a drain of the transistor M41 and a source of the transistor M42 is the node Y3. The signals PREP, PREN, and WE are input to gates of the transistors M41, M43, and M44, respectively. In each of the transistors M41 to M44, a back gate and the gate are electrically connected. When the circuit 24 includes OS transistors in each of which a back gate and a gate are electrically connected, the operating speed of the circuit 24 can be increased without input of a voltage for controlling Vt from the outside.

The circuit 24 is a discharge dynamic logic circuit and the node Y3 is a dynamic node. The signals PREP and PREN function as clock signals for the circuit 24. The period in which the signal PREP is "H" is a discharge period, and the period in which the signal PREP is "L" is an evaluation period. In the discharge period, the voltage VSSM is input to the node Y3 to discharge the node Y3. When the signal WE becomes "H" in the evaluation period, the logic of the node Y3 becomes the same as that of the node A3. In other words, when the signal WE that is "H" is input, the circuit 24 inputs the data DIN to the write bit line WBL.

<Read Circuit 125>

In the read circuit 125, a circuit 25 (see FIG. 5) is provided for each read bit line RBL. The circuit 25 includes a transistor M51, a transistor M52, a transistor M53, a transistor M54, a node A4, and a node Y4. The node A4 is an input node that is electrically connected to the read bit line RBL. The node Y4 is an output node that outputs data RO read from the read bit line RBL. The node Y4 is electrically connected to a circuit 26 provided in the output circuit 126. As described later, the circuit 26 functions as an output buffer circuit.

The transistors M52, M51, and M53 are electrically connected in series between the VSSM line and the VDDM line. The connection node between a drain of the transistor M51 and a source of the transistor M53 is the node Y4. A gate of the transistor M51 is electrically connected to the node A4, and a signal CRE and a signal CREB are input to gates of the transistors M52 and M53, respectively. The signal CRE and the signal CREB are inverses of each other. Back gates of the transistors M51 and M52 are electrically connected to power supply lines for voltages BGR1 and BGR2. In the transistor M53, a back gate and the gate are electrically connected.

In the transistor M54, a gate and a back gate are electrically connected and a signal RST is input to the gate. The transistor M54 controls electrical connection between the node A4 and a power supply line for a voltage VCH. The transistor M54 functions as a reset circuit that initializes the voltage of the node A4. The signal RST controls initialization of the node A4. When the transistor M54 is turned on, the node A4 is fixed at the voltage VCH. Initialization of the node A4 is operation discharging the read bit line RBL to set the voltage of the read bit line RBL to "L". Therefore, the voltage VCH is lower than the voltage VDDM and is a low voltage (e.g., a voltage equal to the voltage VSSM).

The circuit 25 is a charge dynamic logic circuit. The node Y4 is a dynamic node. The signals CRE and CREB function as clock signals for the circuit 25. The period in which the signal CREB is "H" is a charge period, and the period in which the signal CREB is "L" is an evaluation period. In the charge period, the voltage VDDM is input to the node Y4. In the evaluation period, the transistor M53 is in an off state and the transistor M52 is in an on state; thus, the voltage of the node Y4 is determined depending on that of the node A4. Specifically, when the voltage of the node A4 is "H"/"L", that of the node Y4 is "L"/"H".

The back gate voltages of the transistors M51 and M52 are adjustable so that the reading speed can be increased. It is preferable that at least the back gate voltage of the transistor M51 be adjustable. For example, to improve the on-state current characteristics of the transistor M51, the voltage BGR1 is preferably higher than or equal to the voltage VSSM. When the Vt of the transistor M51 is shifted to the negative voltage side, it is possible to shorten the time it takes for the voltage of the node Y4 to become, in the evaluation period, a voltage that allows data determination. For example, a voltage which is the same as the "H" supplied as the signal CRE or a voltage which is the same as the voltage VDDM is used as the voltage BGR1, whereby the number of the kinds of voltages used in the circuit 25 does not increase.

A voltage which is the same as the voltage BGR1 can be used as the voltage BGR2, for example. When the on-state current characteristics of both the transistor M51 and the transistor M52 are improved, the time it takes for the voltage of the node Y4 to become a voltage that allows data determination can be further shortened.

<Output Circuit 126>

Figure 6A:
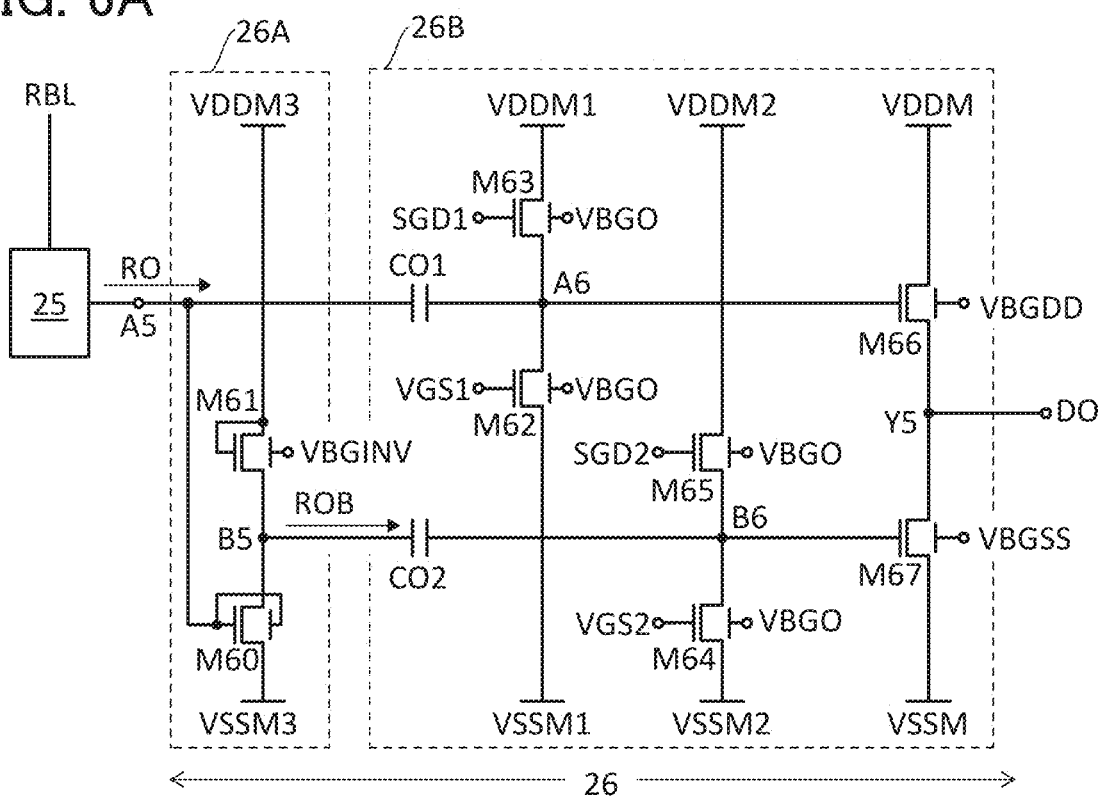
FIG. 6A is a circuit diagram illustrating a configuration example of an output circuit and FIG. 6B is a timing chart showing an operation example of the output circuit.

The output circuit 126 includes 32 circuits 26. The circuit 26 generates data DO from the data RO and temporarily retains the data DO. As illustrated in FIG. 6A, the circuit 26 includes a node A5, a node A6, a node B5, a node B6, a node Y5, a transistor M60, a transistor M61, a transistor M62, a transistor M63, a transistor M64, a transistor M65, a transistor M66, a transistor M67, a capacitor CO1, and a capacitor CO2. To the circuit 26, the voltage VDDM, a voltage VDDM1, a voltage VDDM2, a voltage VDDM3, the voltage VSSM, a voltage VSSM1, a voltage VSSM2, a voltage VSSM3, a voltage VBGINV, a voltage VBGO, a voltage VBGDD, a voltage VBGSS, a signal SGD1, and a signal SGD2 are input. The node A5 is electrically connected to the node Y4 of the circuit 25. For example, the voltage VDDM3 is a high power supply voltage, and the voltage VDDM1 is higher than the voltage VDDM2. The voltages VSSM1, VSSM2, and VSSM3 are low power supply voltages. In this embodiment, the voltage VDDM is 3.3 V, the voltage VDDM1 is 4.0 V, the voltage VDDM2 is 1.0 V, and the voltage VDDM3 is 5.0 V. The voltage VSSM, the voltage VSSM1, the voltage VSSM2, and the voltage VSSM3 are 0 V.

The transistors M60 and M61 form an inverter circuit 26A. The inverter circuit 26A inverts the data RO to generate data ROB. The voltage VBGINV is input to a back gate of the diode-connected transistor M61. In the transistor M60, a gate and a back gate are electrically connected. The gate of the transistor M60 is electrically connected to the node A5, and the data RO is input to the gate of the transistor M60. The node B5 is an output node of the inverter circuit 26A.

For example, when the Vt of the transistor M61 is shifted to the negative voltage side with the use of the voltage VBGINV, the operating speed of the inverter circuit 26A can be increased. Note that the back gate may be electrically connected to the gate in the transistor M61 to change the Vt dynamically.

The capacitors CO1 and CO2 and the transistors M62 to M67 form an output buffer circuit 26B. The output buffer circuit 26B is a differential input capacitively coupled buffer circuit. Two terminals of the capacitor CO1 are electrically connected to the node A5 and the node A6, and two terminals of the capacitor CO2 are electrically connected to the node B5 and the node B6. The nodes A6 and B6 are electrically connected to gates of the transistors M66 and M67, respectively. The connection node between a source of the transistor M66 and a drain of the transistor M67 is the node Y5.

Voltages VGS1 and VGS2 are respectively input to gates of the transistors M62 and M64, and the signals SGD1 and SGD2 are respectively input to gates of the transistors M63 and M65. The voltage VBGO is input to back gates of the transistors M62 to M65, and the voltages VBGDD and VBGSS are respectively input to back gates of the transistors M66 and M67.

The transistors M62 and M64 function as current sources that input bias current to the nodes A6 and B6. The transistors M63 and M65 function as reset circuits that initialize the nodes A6 and B6, respectively. The transistors M66 and M67 form a buffer circuit that outputs, from the node Y5, a signal based on the voltages of the nodes A6 and B6.

Since the back gate voltages of the transistors M62 to M67 are adjustable, the output buffer circuit 26B can achieve improved driving capability and stable operation. Although the voltage VBGO is input to the back gates of the transistors M62 to M65 in the example illustrated in FIG. 6A, a different voltage may be input to some of the back gates. Alternatively, the gate and the back gate may be electrically connected in some of the transistors M62 to M67.

An operation example of the circuit 26 is described with reference to FIG. 6B. First, the circuit 26 is initialized. Specifically, the initial voltage is input to the nodes A6 and B6. The signals SGD1 and SGD2 are set to "H", so that the transistors M63 and M65 are turned on. For example, the signal SGD1 is 7.0 V and the signal SGD2 is 3.3 V. As a result, the voltage VDDM1 (4.0 V) is supplied to the node A6 and the voltage VDDM2 (1.0 V) is input to the node B6. The voltages VDDM1, VDDM2, VBGDD, and VBGSS and the like are set such that the initialization turns on the transistor M66 and turns off the transistor M67.

Figure 6B:
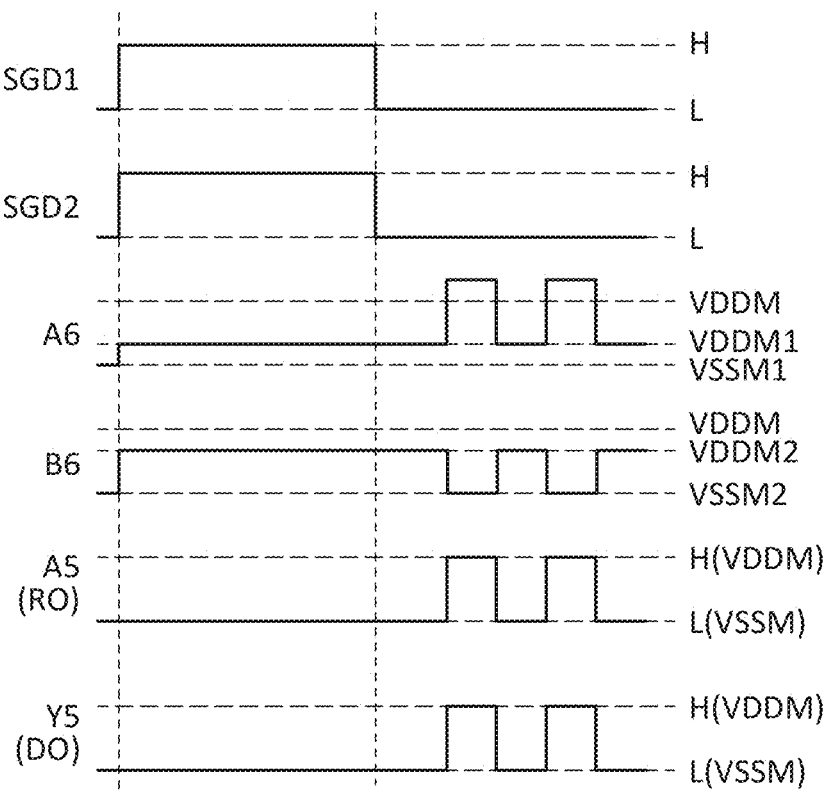

In the example of FIG. 6B, the signals RST and CREB that are "H" and the signal CRE that is "L" are input to the circuit 25 during the initialization period, so that the data RO that is "H" is input to the node A5. Thus, the voltage VSSM3 is input to the node B5.

When the signals SGD1 and SGD2 are set to "L" (the voltage VSSM), the transistors M63 and M65 are turned off and the initialization of the nodes A6 and B6 ends. The node A5 and the node A6 are capacitively coupled and the node B5 and the node B6 are capacitively coupled after the initialization; therefore, the voltages of the nodes A6 and B6 are determined depending on those of the nodes A5 and B5, respectively. When the data RO input to the node A5 changes from "H" to "L", the voltage of the node A6 decreases and the transistor M66 is turned off. In addition, the transistor M60 is turned off and the voltage of the node B5 increases. As a result, the voltage of the node B6 also increases, the transistor M67 is turned on, and the node Y5 outputs "L" (the voltage VSSM) as the data DO. In contrast, when "H" is input as the data RO to the node A5, the node Y5 outputs "H" as the data DO.

In the case where the voltage VDDM1 is equal to the voltage VDDM, in response to input of "H" to the node A5, a voltage that is lower than the voltage VDDM by the Vt of the transistor M66 is output as the data DO. When the voltage VDDM1 is higher than the voltage VDDM, a voltage drop of the data DO at the time of input of "H" to the node A5 can be inhibited. Furthermore, when the node A5 and the node A6 are separated by the capacitor CO1 and the above initialization is performed, output of the data DO can be switched by charging and discharging of the node A5 at the time of actual operation. In a similar manner, when the node B5 and the node B6 are separated by the capacitor CO2 and the above initialization is performed, output of the data DO can be switched by charging and discharging of the node B5 at the time of actual operation. That is, charging and discharging of the node A6 and the node B6 are not needed and thus, the operating speed of the circuit 26 can be increased.

<<Operation Example>>

Figure 7:
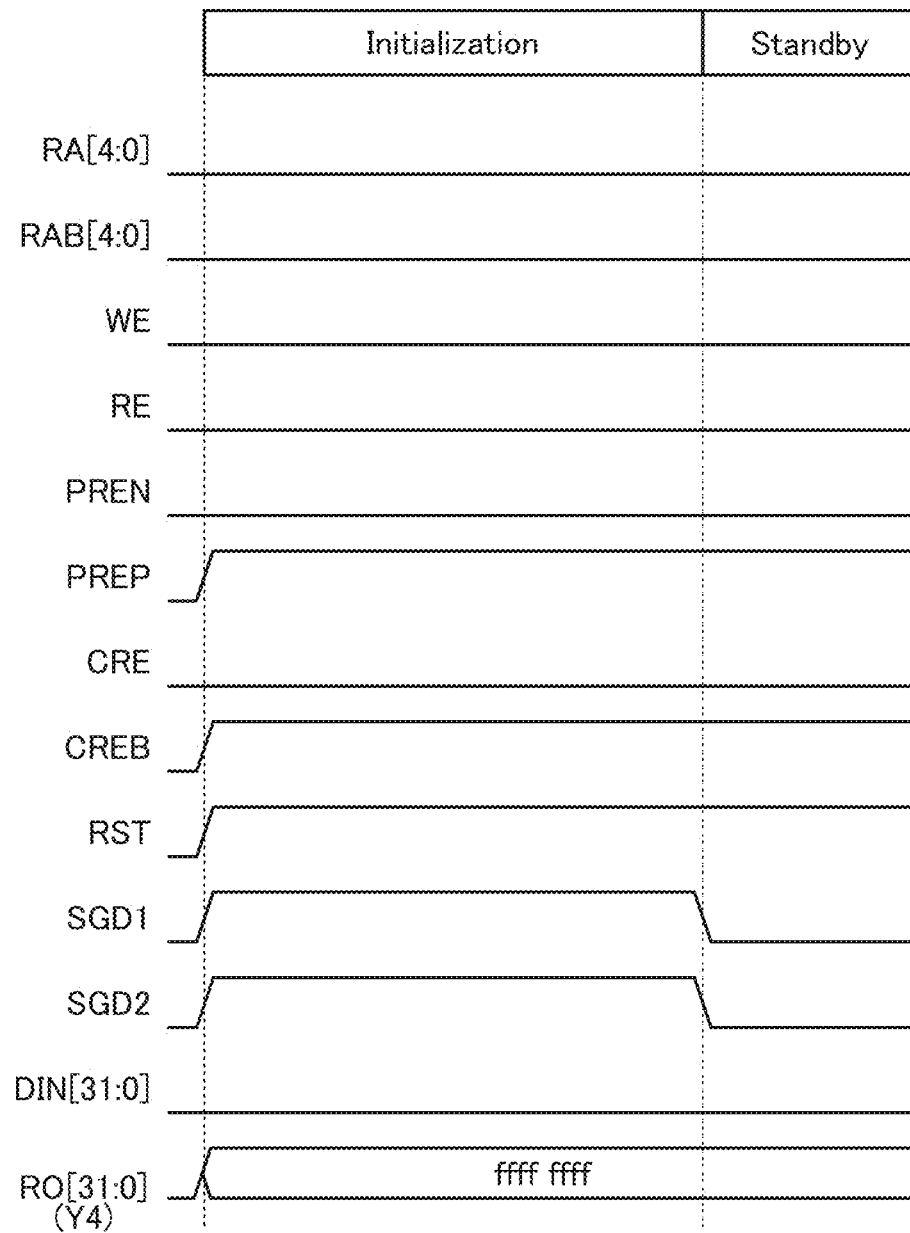
FIG. 7 is a timing chart showing an operation example of a memory device.
Figure 8:
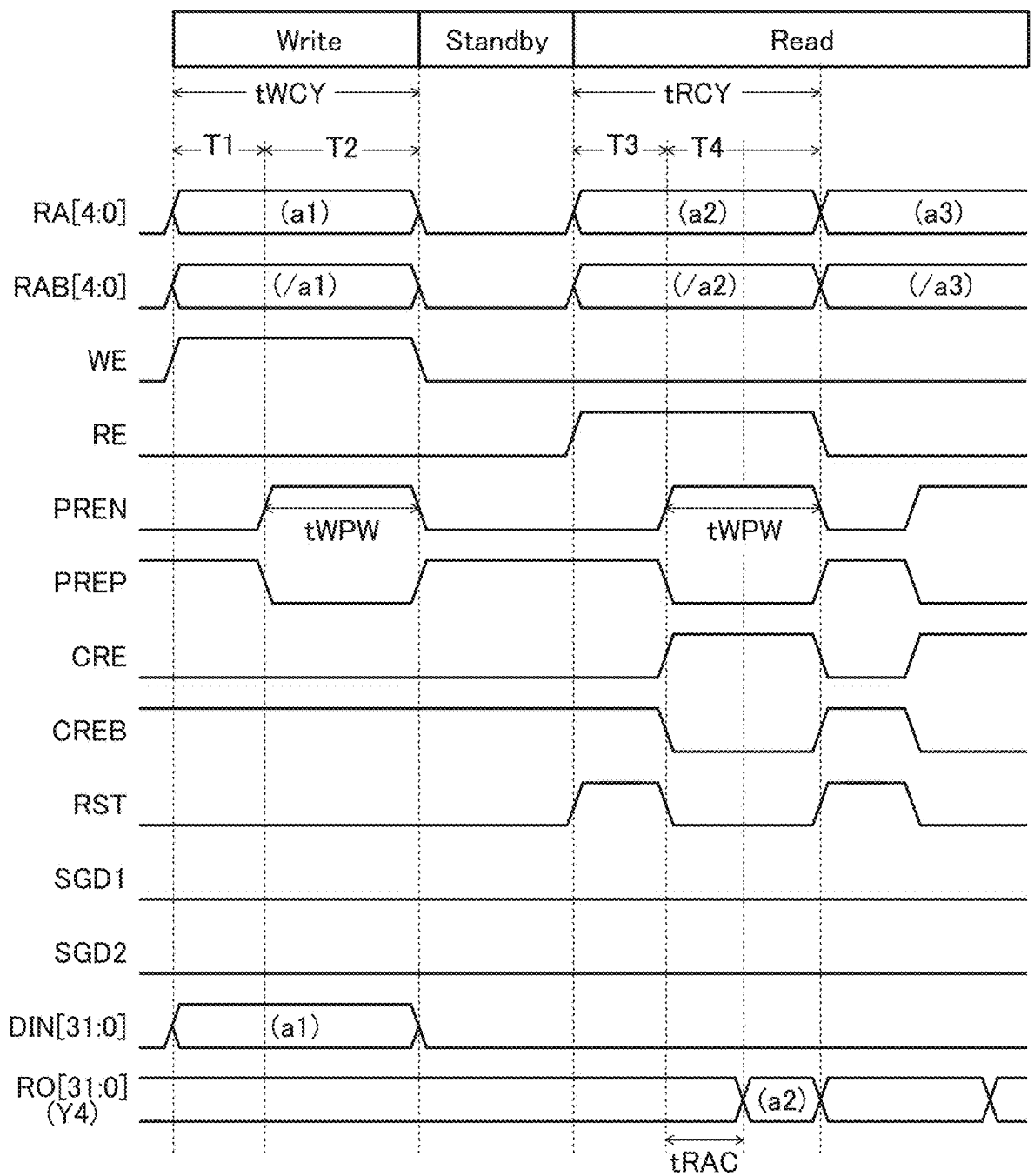
FIG. 8 is a timing chart showing an operation example of a memory device.

FIG. 7 and FIG. 8 are each a timing chart showing an operation example of the memory device 100. Note that in FIG. 8, tWCY is write cycle time, tWPW is write pulse width, tRCY is read cycle time, tRAC is read access time, (a1), (a2), and (a3) are addresses, and (/a1), (/a2), (/a3) are inverted addresses of (a1), (a2), and (a3). Data RO[31:0] are data that are read from the memory cell array 110 by the read circuit 125. Data (a1) is data written in the memory cell 11 at the address (a1), and data (a2) is data read from the memory cell 11 at the address (a2).

<Initialization, Standby State>

Initialization is operation for setting the memory device 100 to a state where writing and reading can be performed, and is executed after the power is turned on, for example. Specifically, the initial voltage is input to each of the read bit line RBL and the nodes A6 and B6 of the circuit 26.

As illustrated in FIG. 7, the signals PREP, CREB, SGD1, and SGD2 become "H". The signals WE and RE are "L". In the circuit 25, the voltage VCH is input to the read bit line RBL. In the circuit 25, the transistor M53 is turned on and the node Y4 is fixed at the voltage VDDM. Accordingly, the read circuit 125 outputs ffffffff (hexadecimal notation) as the data RO[31:0]. The voltages VDDM1 and VDDM2 are respectively input to the nodes A6 and B6 of the circuit 26. When the signals SGD1 and SGD2 become "L", the memory device 100 is brought into a standby state.

<Write Operation>

An example of write operation is described with reference to FIG. 8. When the signals WE and RE are respectively "H" ("1") and "L" ("0"), the memory device 100 performs write operation.

In a period T1, the write word line WWL and the write bit line WBL are discharged. The signal PREP is "H". The voltage VSSM is input to the write word lines WWL<0> to WWL<31> by the row decoder 122, and the voltage VSSM is input to the write bit lines WBL<0> to WBL<31> by the write circuit 124. During the write operation, the row decoder 122 fixes the read word lines RWL<0> to RWL<31> at voltage VSS.

In a period T2, data are written in the memory cells 11 that are specified by the address signals RA[4:0]. The signals PREP and PREN are respectively "L" and "H". The write circuit 124 writes the data DIN[0] to DIN[31] in the write bit lines WBL<0> to WBL<31>, respectively. The row decoder 122 becomes active and decodes the address signals RA[4:0] and RAB[4:0]. For example, when the address (a1) is "00001", the row decoder 122 outputs a selection signal that is "H" to the write word line WWL<1>. Thus, the memory cells 11<1,0> to 11<1,31> are brought into a selected state. The transistors M1<1,0> to M1<1,31> are turned on and the data DIN[0] to DIN[31] are respectively written in the nodes SN<1,0> to SN<1,31>. When the signals PREP and PREN become "H" and "L", respectively, one cycle of write operation is completed, and all of the memory cells 11 are brought into a non-selected state.

<Read Operation>

An example of read operation is described with reference to FIG. 8. When the signals WE and RE are "L" and "H", respectively, the memory device 100 executes read operation.

In a period T3, the read bit line RBL is reset and the read word line RWL is discharged. The signals PREP, RST, CRE, and CREB are respectively "H", "H", "L", and "H". The read word lines RWL<0> to RWL<31> are fixed at the voltage VSSM by the row decoder 122. The read bit lines RBL<0> to RBL<31> are fixed at the voltage VCH by the read circuit 125, and the output node (the node Y4) of the circuit 25 is fixed at the voltage VDDM. Note that the write word lines WWL<0> to WWL<31> are fixed at the voltage VSS by the row decoder 122 during the read operation.

In a period T4, the data (a2) is read from the memory cell array 110. The signals PREP and PREN are respectively "L" and "H". The row decoder 122 becomes active and decodes the address signals RA[4:0] and RAB[4:0]. For example, when the address (a2) is "00010", the row decoder 122 outputs a selection signal that is "H" to the read word line RWL<2> to bring the memory cells 11<2,0> to 11<2,31> into a selected state. The transistors M3<2,0> to M3<2,31> are turned on, and the data retained in the memory cells 11<2,0> to 11<2,31> are written in the read bit lines RBL<0> to RBL<31>, respectively. The read circuit 125 reads the data of the read bit lines RBL<0> to RBL<31> and outputs the data as the data RO[31:0] to the output circuit 126. More specifically, the voltage of the node Y4 of the circuit 25 is determined depending on the voltage of the read bit line RBL. The circuit 26 outputs "0" ("L") or "1" ("H") as the data DO, in accordance with the voltage of the node Y4. The read access time tRAC is the time elapsed between transition of the signals CRE and PREN from "L" to "H" and determination of whether the voltage of the node Y4 is "0" or "1".

Figure 9:
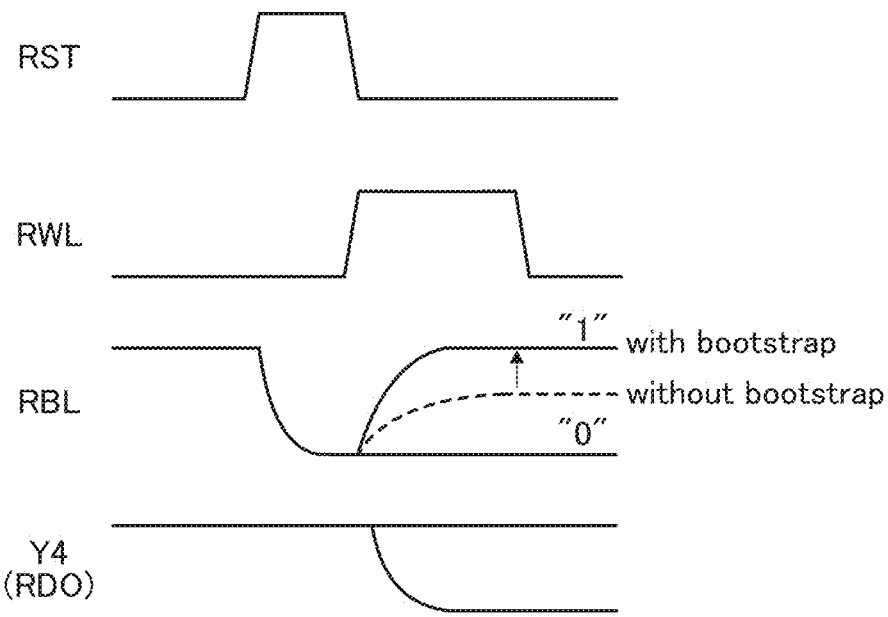
FIG. 9 is a schematic diagram showing output waveforms of a read bit line and a read circuit.

An operation example of the memory cell 11 and the circuit 25 is described with reference to FIG. 5, FIG. 8, and FIG. 9. FIG. 9 schematically shows output waveforms of the read bit line RBL and the node Y4 in read operation.

When the signal RST becomes "H", the transistor M54 is turned on and the read bit line RBL is discharged. Since the parasitic capacitance of the read bit line RBL is relatively high, inputting a fixed voltage to the read bit line RBL by discharging, not by charging, is effective in increasing the reading speed. When the signal RST becomes "L", the transistor M54 is turned off and the read bit line RBL is brought into an electrically floating state. During the period when the signal RST is "H", the transistor M53 is in an on state and data "1" ("H") is thus written in the node Y4.

Next, the signal RST is set to "L" and the voltage of the read word line RWL is set to "H". The transistor M3 is turned on. In the case where data "0" is written in the node SN, the transistor M2 is in an off state and thus, the voltages of the read bit line RBL and the node Y4 do not change. That is, "1" ("H") is retained as the data RO.

In the case where the data "1" is written in the node SN, the transistor M2 is in an on state. Therefore, the read bit line RBL is charged with the drain current of the transistor M2. Since the node SN is capacitively coupled with the read bit line RBL, the voltage of the node SN increases as the voltage of the read bit line RBL increases, owing to a bootstrap effect. Accordingly, the drain current of the transistor M2 increases and charging of the read bit line RBL is accelerated. Then, the transistor M52 is turned on, whereby the node Y4 is discharged and the data RO becomes "0" ("L").

Note that the data RO is inverted data of the data retained in the memory cell 11. Accordingly, the data DO is also inverted data. To make the data DO have the same logic as the data retained in the memory cell 11, the circuit configuration of the circuit 26 may be changed such that the data RO is inverted. For example, the node B5 is electrically connected to the capacitor CO1 and the node A5 is electrically connected to the capacitor CO2.

Note that when the node SN and the VSSM line are capacitively coupled with the capacitor CS1, the voltage of the read bit line RBL changes as indicated by the dotted line. In this case, the bootstrap effect is not caused and thus, the read bit line RBL is charged at a low speed. In some cases, the voltage of the read bit line RBL is not increased to a voltage that allows data determination in the period when the read word line RWL is in a selected state. In other words, a bootstrap effect can be utilized to shorten the read access time tRAC and reduce the number of reading errors.

In order to increase the reading speed, the Vt of the transistor M2 is preferably shifted to the negative voltage side with the voltage Vbg2 to improve the on-state current characteristics. In that case, an increase in leakage current from the non-selected memory cell 11 to the read bit line RBL causes problems. Leakage current from the non-selected memory cell 11 leads to not only shortened data retention time but also data reading errors. Therefore, the off-state current characteristics are prioritized over the on-state current characteristics in the transistor M3 and thus, the voltage Vbg3 is set to be lower than the voltage Vbg2.

For long-term data retention, the off-state current of the transistor M1 is preferably low. Accordingly, the voltage Vbg1 is preferably lower than or equal to the voltage Vbg3.

The memory cell 11 has a 3T1C configuration, a Vt drop of the voltage of the read bit line RBL becomes apparent; however, a bootstrap effect can prevent a Vt drop of the voltage of the read bit line RBL. In other words, the use of a 3T1C gain cell having a bootstrap effect for the memory cell 11 makes it possible to provide the memory device 100 having excellent data retention characteristics and a high operating speed. In addition, the use of a charging dynamic logic circuit in the read circuit 125 is effective in shortening the read access time tRAC.

(Modification Example of Memory Cell)

Figure 10:
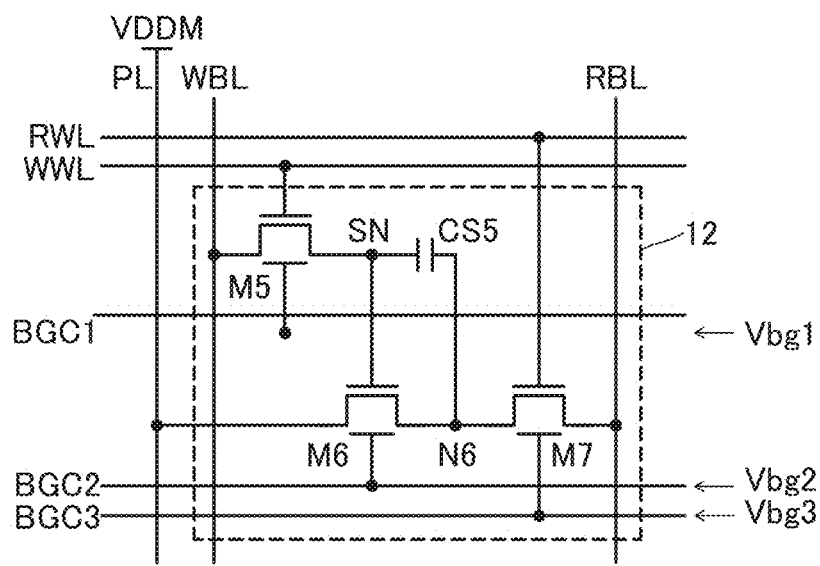
FIG. 10 is a circuit diagram illustrating a configuration example of a memory cell.

FIG. 10 illustrates another configuration example of a memory cell having a bootstrap effect. A memory cell 12 illustrated in FIG. 10 is a modification example of the memory cell 11 and includes a transistor M5, a transistor M6, a transistor M7, a capacitor CS5, the node SN, and a node N6. The transistors M5, M6, and M7 are a write transistor, a readout transistor, and a selection transistor, respectively. Back gates of the transistors M5, M6, and M7 are electrically connected to the wirings BGC1, BGC2, and BGC3, respectively. A first terminal and a second terminal of the capacitor CS5 are electrically connected to the nodes SN and N6, respectively. The node N6 is the connection node between the transistor M6 and the transistor M7. The voltages Vbg1, Vbg2, and Vbg3 are set as in the memory cell 11.

The memory cell 12 operates in a manner similar to that of the memory cell 11. When the read word line RWL is selected, the transistor M7 is turned on. When the node SN retains "1", the node N6 is charged with the drain current of the transistor M6. Thus, the voltage of the node SN increases in accordance with an increase in the voltage of the node N6 owing to a bootstrap effect. As a result, an increase in the voltage of the read bit line RBL is accelerated.

P-channel transistors are not used in the memory device 100. A smaller number of masks are needed, which can reduce the manufacturing cost. Unlike a complementary circuit that needs to be designed such that a latch-up does not occur, the memory device 100 is free from a latch-up, thereby achieving high layout flexibility and high-density arrangement of patterns.

Since a single-conductivity-type dynamic logic circuit is used, the number of transistors in the peripheral circuit 120 is small. Reducing the number of transistors in the peripheral circuit 120 is effective in reducing the size and power consumption of the memory device 100. Table 1 compares the number of transistors in the peripheral circuit 120 with the number of transistors in the peripheral circuit of the OS memory device disclosed in Non-Patent Document 2. Note that the number of transistors per 32 bit lines of the peripheral circuit 120 is the number of transistors in the read circuit 125 and does not include the number of transistors in the output circuit 126. The peripheral circuit disclosed in Non-Patent Document 2 is formed of a CMOS static logic circuit. The number of transistors in Non-Patent Document 2 is the approximate total number of transistors of the CMOS static logic circuit, which corresponds to the row decoder 122, the write circuit 124, and the read circuit 125.

TABLE 1

| | Embodiment 1<br>Peripheral circuit 120 | Non-Patent Document 2<br>CMOS logic circuit |
|---|---|---|
| Number of transistors/<br>32 word lines | 255 | ~1200 |
| Number of transistors/<br>32 bit lines | 256 | ~900 |

As described above, this embodiment makes it possible to provide an OS memory device with a high operating speed, high rewrite endurance, excellent data retention characteristics, low power consumption, and a reduced number of transistors. The specific performance of the OS memory device in this embodiment will be described in Example 2.

Embodiment 2

A manufacturing technique for OS transistors is compatible with a CMOS manufacturing technique, and a single-conductivity-type memory device including OS transistors can be stacked over a CMOS logic circuit. In this embodiment, a semiconductor device that includes a CMOS circuit using Si transistors and a single-conductivity-type circuit using OS transistors is described.

When including only OS transistors, the memory device in Embodiment 1 is suitable for a relatively small-scale (e.g., 128-bit to 1-Mbit) memory device.

Figure 11:
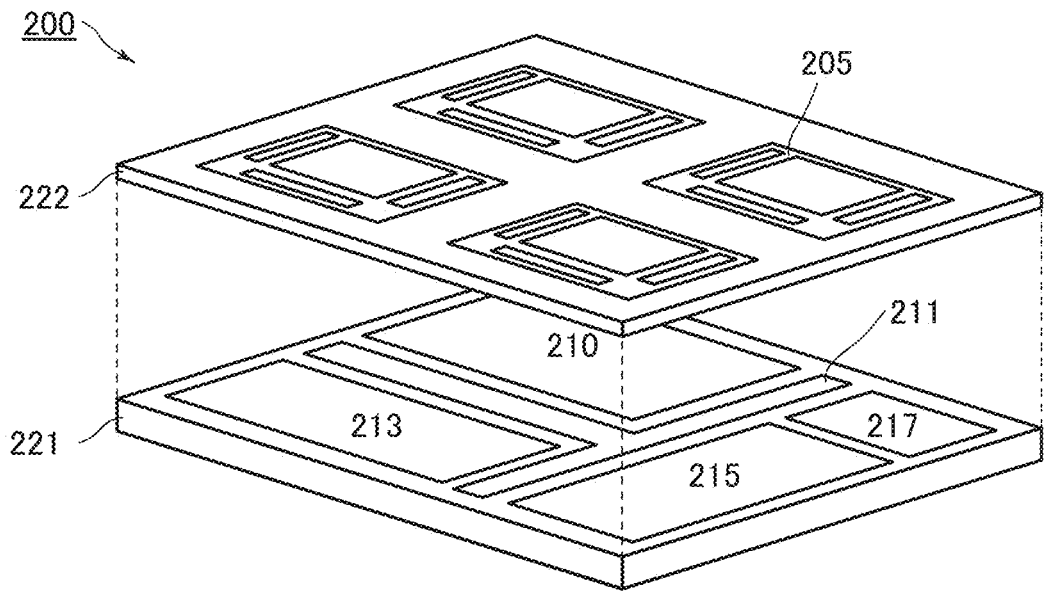
FIG. 11 is a schematic perspective view illustrating a configuration example of a chip of an application processor.

For example, an embedded memory device 205 of an application processor (AP) 200 illustrated in FIG. 11 includes the memory device described in Embodiment 1. FIG. 11 is a schematic view of a chip of the AP 200. The AP 200 is a system-on-chip. The chip of the AP 200 has a stacked-layer structure including a CMOS transistor layer 221 and an OS transistor layer 222. The CMOS transistor layer 221 is provided with various kinds of functional circuits included in the AP 200, such as a CPU 210, a bus 211, peripheral circuits 213 and 215, and an input/output interface circuit 217. The peripheral circuits 213 and 215 include a power supply circuit, a communication circuit, an image processing circuit, a sound processing circuit, and the like.

The OS transistor layer 222 includes a plurality of embedded memory devices 205. Note that the number of the embedded memory devices 205 may be one. Data communication between the embedded memory device 205 and the CPU 210 and the like is performed in the CPU 210 through the bus 211. The embedded memory device 205 stores, for example, configuration data of the AP 200. Although it is possible to use an external EEPROM chip for such a use, employing the embedded memory device 205 effectively reduces the cost, size, and power consumption of the AP 200.

A plurality of OS transistor layers 222 can be stacked over the CMOS transistor layer 221. For example, in the case where two OS transistor layers 222 are provided, a peripheral circuit of the embedded memory device 205 is provided in the lower layer and a memory cell array is provided in the upper layer. Alternatively, a peripheral circuit and a memory cell array are provided in the lower layer and a memory cell array is provided in the upper layer.

Needless to say, the semiconductor device to which the memory device described in Embodiment 1 can be applied is not limited to an application processor. The memory device described in Embodiment 1 can be provided in various kinds of semiconductor devices such as a microcontroller unit (MCU), a CPU, a GPU, an FPGA, an imaging device, and a display device.

Figure 12A:
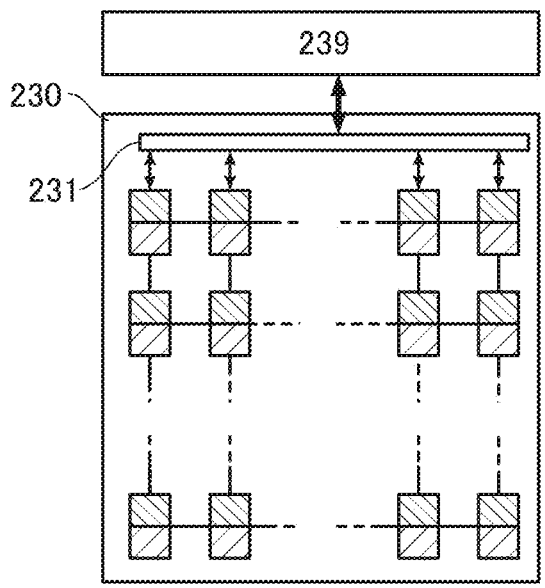
FIG. 12A is a block diagram illustrating a configuration example of an arithmetic processing unit and FIG. 12B is a block diagram schematically illustrating a layered structure example of a processing engine and an embedded memory device.

For example, an arithmetic processing device 230 illustrated in FIG. 12A includes a plurality of embedded memory devices 235. The memory device described in Embodiment 1 can be used as the embedded memory device 235. The arithmetic processing device 230 further includes a bus interface (I/F) 231 and a plurality of processing engines (PE) 233. Data transmission between the arithmetic processing device 230 and an external memory device 239 is performed through the bus I/F 231. A DRAM, a flash memory, an SRAM, or the like is used for the external memory device 239.

Figure 12B:
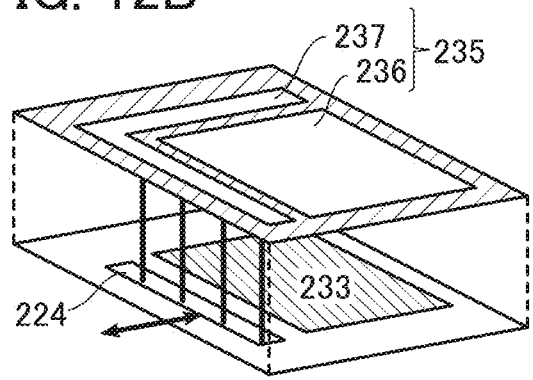

A chip of the arithmetic processing device 230 has a stacked-layer structure similar to that of the AP 200. The embedded memory devices 235 are provided in an OS transistor layer, and the bus I/F 231 and the PEs 233 are provided in a CMOS transistor layer. The PE 233 is formed of a CMOS logic circuit using a Si transistor and performs arithmetic processing. As illustrated in FIG. 12B, the embedded memory device 235 is stacked over the PE 233. The embedded memory device 235 includes a memory cell array 236 and a peripheral circuit 237. The memory cell array 236 and the peripheral circuit 237 include OS transistors. Because of its small number of transistors, the embedded memory device 235 can be stacked over the PE 233 without a large increase in the footprint. A control circuit 224 illustrated in FIG. 12B is formed of a CMOS logic circuit. The control circuit 224, for example, generates a control signal for the embedded memory device 235 and controls data transmission between the PE 233 and the bus I/F 231.

A plurality of PEs 233 are arranged in an array so that parallel arithmetic processing is performed. For efficient parallel arithmetic processing using an arithmetic processing device, an embedded memory device with low power consumption, a high operating speed, and high rewrite endurance is necessary. The embedded memory device 235 satisfies such requirements. When the embedded memory device 235 is provided close to the PE 233, the time and power required for data transmission can be reduced and the PE 233 can operate very efficiently. By having low power consumption and high performance, the arithmetic processing device 230 is suitable for scientific computation, machine learning (e.g., deep learning), and the like, and can be used as an accelerator for machine learning, for example.

Figure 13:
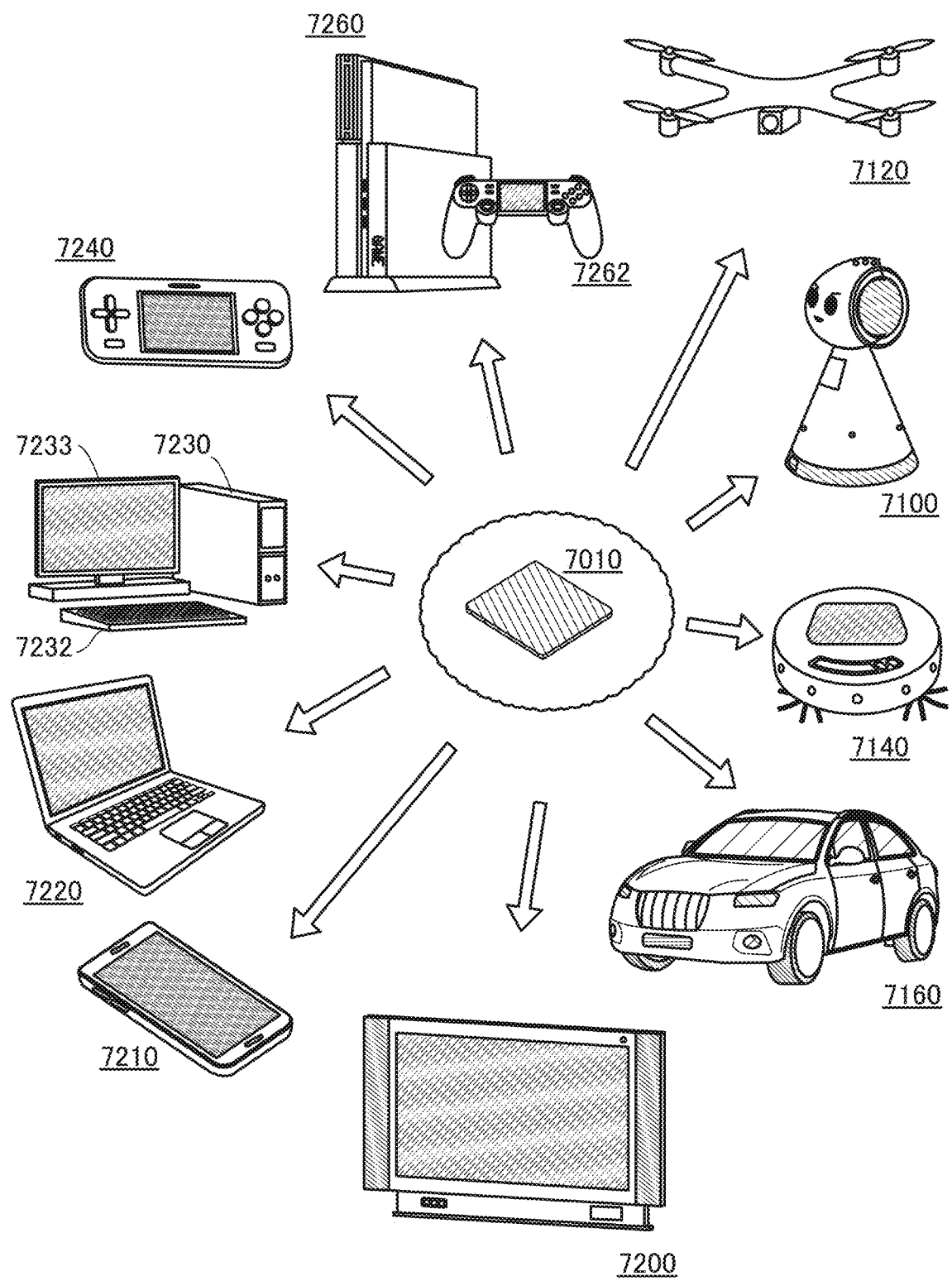
FIG. 13 is a schematic diagram illustrating structure examples of electronic devices.

As illustrated in FIG. 13, a processor chip 7010 including the memory device 100 in Embodiment 1 can be incorporated in various kinds of electronic devices.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The processor chip 7010 controls these peripheral devices.

The microphone has a function of detecting audio signals such as the user's voice and an environmental sound. The speaker has a function of outputting audio signals such as voice and a warning beep. The robot 7100 can analyze an audio signal that is input via the microphone and can output a necessary audio signal from the speaker. The robot 7100 can communicate with the user using the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether or not there is an obstacle in moving.

A flying object 7120 includes a propeller, a camera, a battery, and the like and has a function of flying autonomously. These peripheral devices are controlled by the processor chip 7010. For example, the processor chip 7010 can analyze image data taken by the camera, to sense whether or not there is an obstacle in moving.

A cleaning robot 7140 includes a display provided on the top surface, a plurality of cameras provided on the side surface, a brush, an operation button, various kinds of sensors, and the like. Although not illustrated, the cleaning robot 7140 is provided with a tire, an inlet, and the like. The cleaning robot 7140 is self-propelled, detects dust, and sucks up the dust through the inlet provided on the bottom surface. For example, the processor chip 7010 can analyze an image taken by the cameras, to determine whether or not there is an obstacle such as a wall, furniture, or a step. In the case where the cleaning robot 7140 detects an object that is likely to be caught in the brush (e.g., a wiring) by analyzing an image, the rotation of the brush can be stopped.

An automobile 7160 includes an engine, tires, a brake, a steering gear, a camera, and the like. For example, the processor chip 7010 performs control for optimizing the running state of the automobile 7160 in accordance with navigation information, speed, the state of the engine, the gearshift state, the frequency of use of the brake, and other data.

The processor chip 7010 can be incorporated in a television receiving (TV) device 7200, a smartphone 7210, personal computers (PCs) 7220 and 7230, game consoles 7240 and 7260, and the like. For example, the processor chip 7010 incorporated in the TV device 7200 can function as an image engine. The processor chip 7010 performs, for example, image processing such as noise removing and resolution up-conversion. The smartphone 7210 is an example of a portable information terminal. The smartphone 7210 includes a microphone, a camera, a speaker, various kinds of sensors, and a display portion. The processor chip 7010 controls these peripheral devices.

The PCs 7220 and 7230 are respectively examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The processor chip 7010 can also be incorporated in the controller 7262.

Embodiment 3

Structure examples of OS transistors will be described with reference to FIGS. 14A and 14B. Cross-sectional views of the OS transistors in the channel length direction are shown on the left side of FIGS. 14A and 14B, and cross-sectional views of the OS transistors in the channel width direction are shown on the right side of FIGS. 14A and 14B.

Figure 14A:
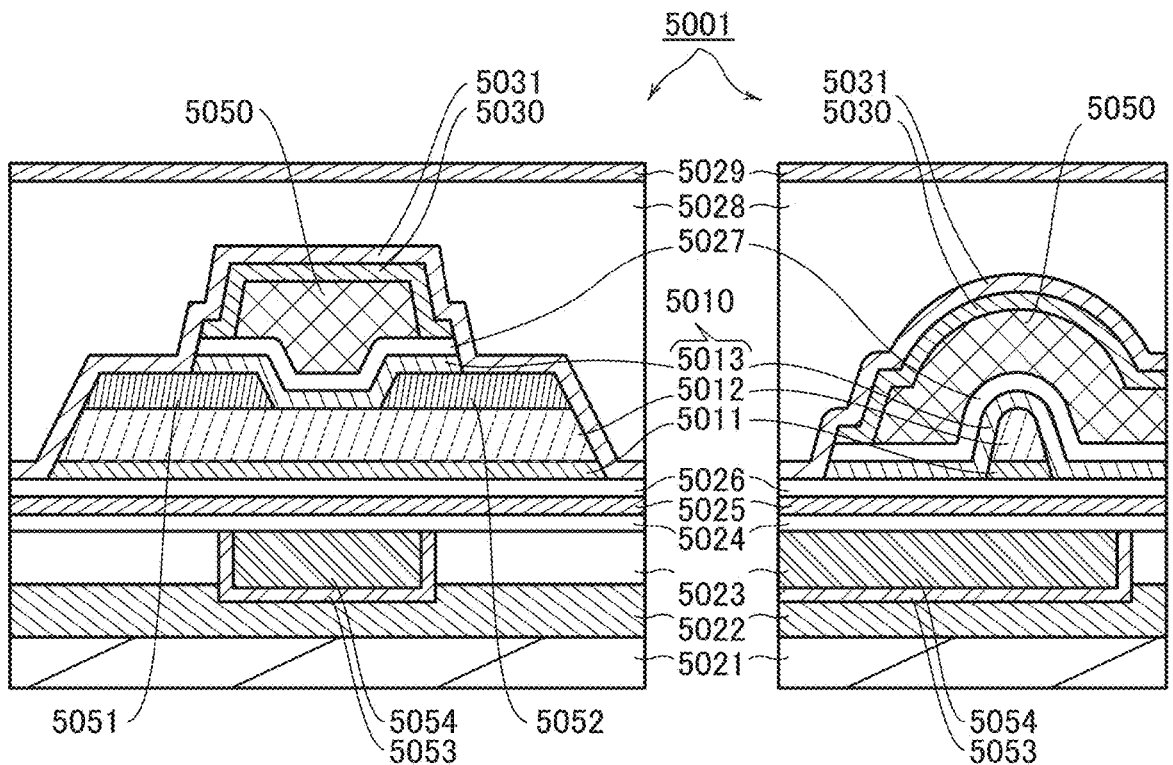
FIGS. 14A and 14B are cross-sectional views illustrating structure examples of OS transistors.

An OS transistor 5001 illustrated in FIG. 14A is formed over an insulating surface, here, over an insulating layer 5021. The OS transistor 5001 is covered with insulating layers 5028 and 5029. The OS transistor 5001 includes insulating layers 5022, 5023, 5024, 5025, 5026, 5027, 5028, 5029, 5030, and 5031, metal oxide layers 5011, 5012, and 5013, and conductive layers 5050, 5051, 5052, 5053, and 5054.

Note that an insulating layer, a metal oxide layer, a conductive layer, and the like in a drawing may have a single-layer structure or a layered structure. These components can be formed by any of a variety of deposition methods such as a sputtering method, a molecular beam epitaxy (MBE) method, a pulsed laser ablation (PLA) method, a chemical vapor deposition (CVD) method, and an atomic layer deposition (ALD) method. Examples of CVD methods include a plasma-enhanced CVD method, a thermal CVD method, and a metal organic CVD method.

The metal oxide layers 5011 to 5013 are collectively referred to as a metal oxide layer 5010. As illustrated in FIG. 14A, the metal oxide layer 5010 includes a portion where the metal oxide layer 5011, the metal oxide layer 5012, and the metal oxide layer 5013 are stacked in this order. When the OS transistor 5001 is on, a channel is formed mainly in the metal oxide layer 5012.

A gate electrode of the OS transistor 5001 is formed of the conductive layer 5050. A pair of electrodes that function as a source electrode and a drain electrode of the OS transistor 5001 are formed of the conductive layers 5051 and 5052. The metal oxide layer 5010 and the conductive layers 5050 to 5052 are covered with the insulating layer 5031 that functions as a barrier layer. A back gate electrode of the OS transistor 5001 is formed of a stack of the conductive layers 5053 and 5054. The OS transistor 5001 does not necessarily include a back gate electrode. The same applies to an OS transistor 5003 to be described later. A gate insulating layer on the gate (front gate) side is formed of the insulating layer 5027. A gate insulating layer on the back gate side is formed of a stack of the insulating layers 5024 to 5026.

FIG. 14A illustrates an example in which the metal oxide layer 5010 has a three-layer structure; however, one embodiment of the present invention is not limited thereto. For example, the metal oxide layer 5010 can have a two-layer structure without the metal oxide layer 5011 or 5013 or may be composed of one of the metal oxide layers 5011 to 5013. Alternatively, the metal oxide layer 5010 may be composed of four or more metal oxide layers.

Examples of conductive materials used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing the above metal as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., a tungsten layer). With such a structure, a stack of the conductive layer 5053 and the conductive layer 5054 functions as a wiring and has a function of inhibiting diffusion of hydrogen into the metal oxide layer 5010.

Examples of insulating materials used for the insulating layers 5021 to 5031 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5031 are formed using a single-layer structure or a layered structure of any of these insulating materials. The layers used for the insulating layers 5021 to 5031 may include a plurality of insulating materials.

Note that in this specification, an oxynitride refers to a compound in which the oxygen content is higher than the nitrogen content, and a nitride oxide refers to a compound in which the nitrogen content is higher than the oxygen content.

In the OS transistor 5001, the metal oxide layer 5010 is preferably surrounded by an insulating layer with oxygen and hydrogen barrier properties (hereinafter such an insulating layer is referred to as a barrier layer). Such a structure makes it possible to inhibit the release of oxygen from the metal oxide layer 5010 and entry of hydrogen into the metal oxide layer 5010; thus, the reliability and electrical characteristics of the OS transistor 5001 can be improved. For example, the insulating layer 5031 functions as a barrier layer and at least one of the insulating layers 5021, 5022, and 5024 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

Figure 14B:
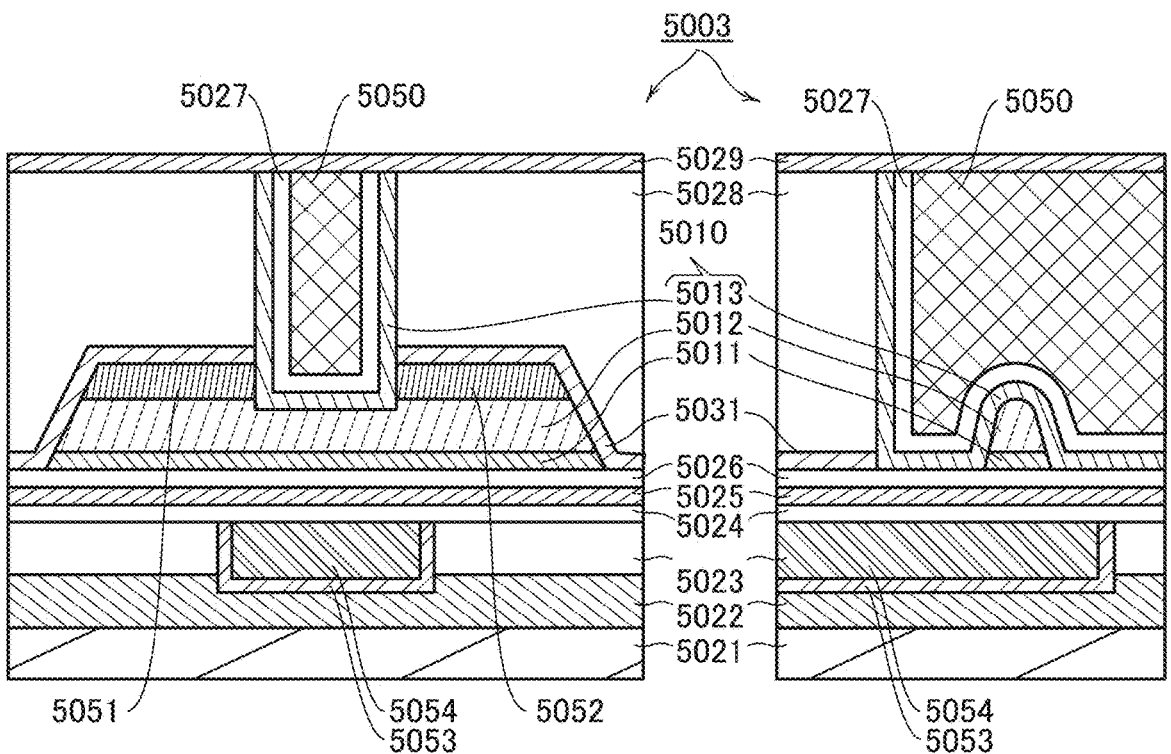

The OS transistor 5003 illustrated in FIG. 14B is a modification example of the OS transistor 5001 and differs from the OS transistor 5001 mainly in the structure of the gate electrode. The metal oxide layer 5013, the insulating layer 5027, and the conductive layer 5050 are provided in an opening portion formed in the insulating layer 5028 and the insulating layer 5031. In other words, the gate electrode is formed in a self-aligning manner by utilizing this opening portion. Accordingly, the gate electrode width can be controlled by the size of the opening portion; thus, it is easy to fabricate an OS transistor with a short channel length. Furthermore, the gate electrode (5050) does not include a region that overlaps with the source electrode and the drain electrode (5051 and 5052) with the gate insulating layer (5027) provided therebetween; thus, the parasitic capacitance between the gate and the source and that between the gate and the drain are reduced, and the frequency characteristics are improved.

Example 1

In this example, an OS dynamic logic circuit is described.

Figure 15A:
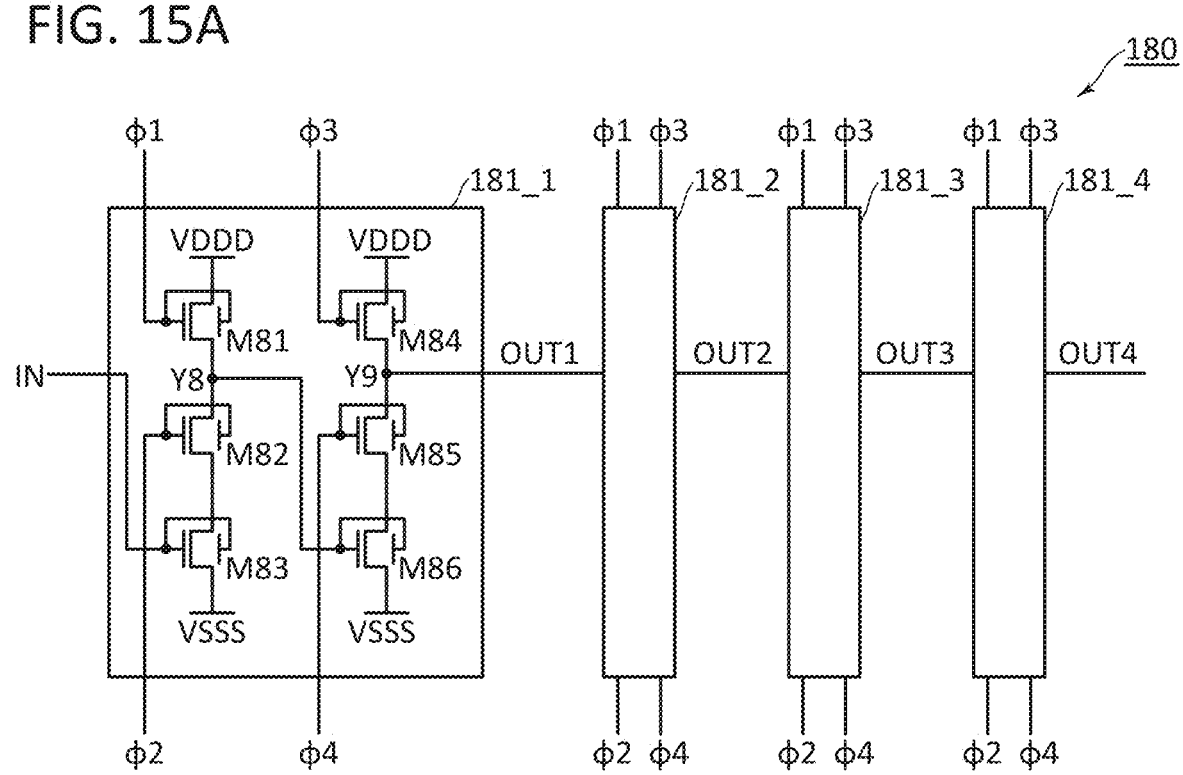
FIG. 15A is a circuit diagram of a fabricated 4-stage shift register and FIG. 15B shows operation waveforms of the 4-stage shift register.

A 4-stage shift register 180 was fabricated through a 60-nm OS transistor process. As illustrated in FIG. 15A, the 4-stage shift register 180 includes shift registers 181_1, 181_2, 181_3, and 181_4, and clock signals $\phi 1$, $\phi 2$, $\phi 3$, and $\phi 4$ and voltages VDDD and VSSS are input to the 4-stage shift register 180. The shift register 181_1 is an OS dynamic logic circuit and includes transistors M81, M82, M83, M84, M85, and M86 and nodes IN, Y8, and Y9. The nodes Y8 and Y9 are dynamic nodes. A gate of the transistor M83 is an input node and the node Y9 is an output node. The node Y9 is electrically connected to the input node of the shift register 181_2. The transistor M81 is an OS transistor, and channel formation regions of the transistors M81 to M86 were formed using crystalline In—Ga—Zn oxide layers. The shift registers 181_2, 181_3, and 181_4 have the same circuit configuration as the shift register 181_1.

Figure 15B:
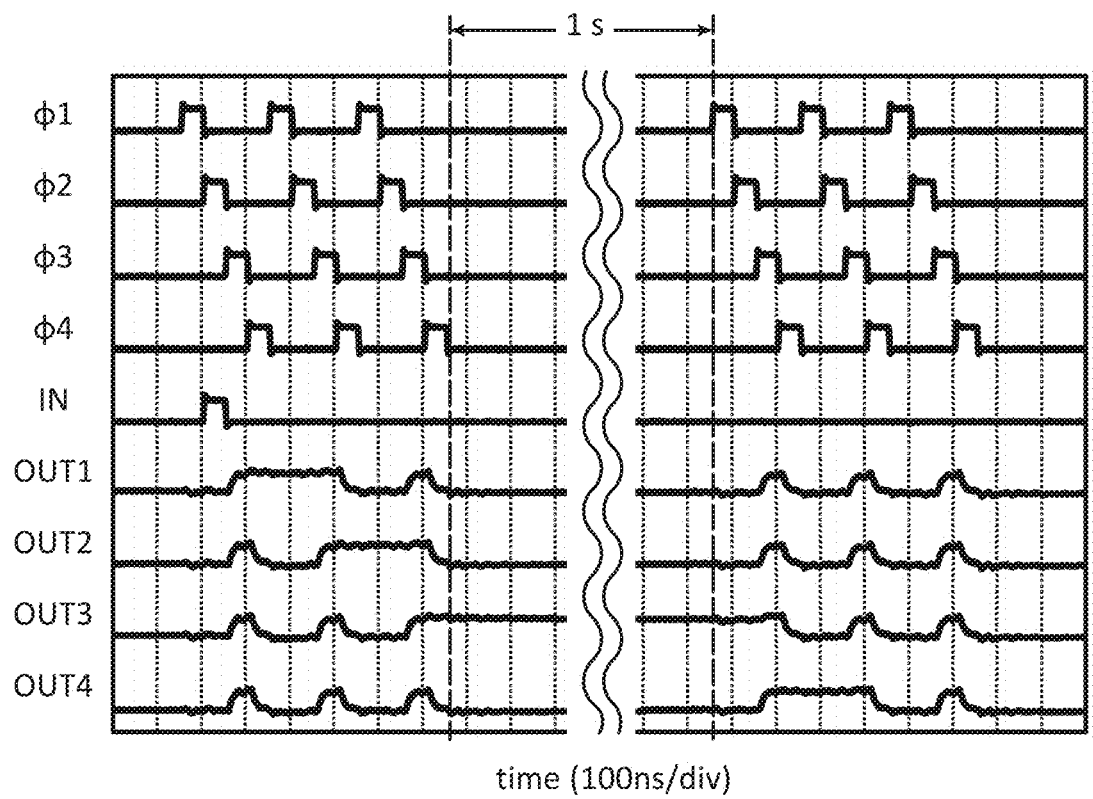

FIG. 15B shows the measured operation waveform of the 4-stage shift register 180. The voltages VSSS and VDDD were respectively 0 V and 3.3 V. The "L" and "H" of the clock signals $\phi 1$ to $\phi 4$ were respectively 0 V and 5.0 V. In FIG. 15B, a signal IN is a pulse signal input to the node IN, and signals OUT1, OUT2, OUT3, and OUT4 are respectively output signals of the shift registers 181_1, 181_2, 181_3, and 181_4. The signal IN was shifted sequentially by the shift registers 181_1, 181_2, and 181_3. When the pulse signal shifted by the shift register 181_3 was output and the clock signal $\phi 4$ fell, the input of the clock signals $\phi 1$ to $\phi 4$ and the voltage VDDD was stopped. After one second, the clock signals $\phi 1$ to $\phi 4$ and the voltage VDDD were input again, so that the shift register 181_4 output a shifted pulse. This means that the 4-stage shift register 180 operated normally after power gating. This is because the voltages of the nodes Y8 and Y9 of the shift registers 181_1, 181_2, 181_3, and 181_4 were retained during the power gating.

Thus, this example shows that a dynamic logic circuit using OS transistors can perform power gating even when not including a circuit for retaining the voltage of a dynamic node.

Example 2

In this example, the design, manufacture, performance, and the like of the memory device 100 described in Embodiment 1 will be described.

<Operating Speed>

Figure 16:
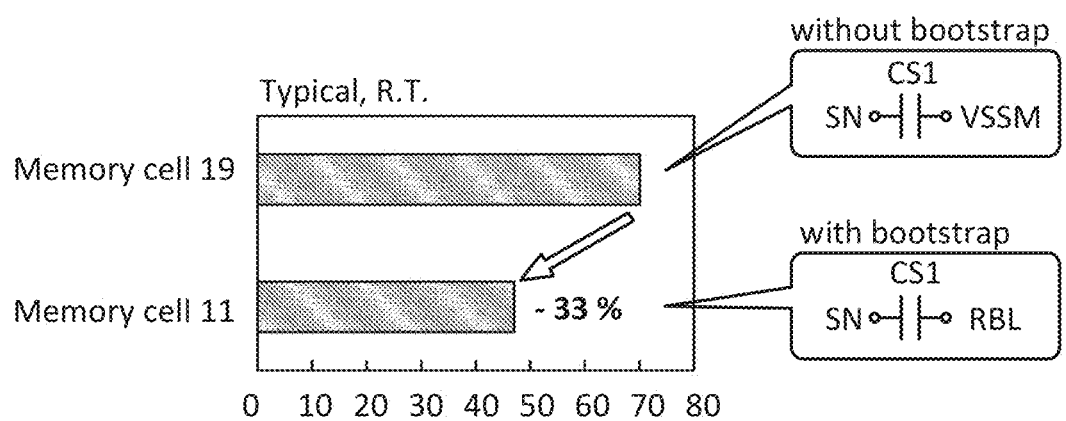
FIG. 16 shows calculation results of read access time of memory cells.

The read access time tRAC of the data "1" of each of the memory cell 11 and a memory cell 19 was calculated by simulation. FIG. 16 shows the calculation results. The W/L (channel width/channel length) of each of the transistors M1, M2, and M3 are 60 nm/60 nm. The capacitance of the capacitor CS1 is 1.2 fF. The back gate voltages (Vbg1, Vbg2, and Vbg3) of the transistors M1, M2, and M3 are −5 V, 8 V, and 2 V, respectively, and the voltages VSSM and VDDM are respectively 0 V and 3.3 V. The parameters of the manufacturing process are typical values and the temperature is room temperature (R.T.).

The memory cell 19 is a comparative example, where the first terminal and the second terminal of the capacitor CS1 are electrically connected to the node SN and the VSSM line, respectively. The memory cell 19 has the same structure as the memory cell 11 except for that point. Even when the read word line RWL is brought into a selected state, a bootstrap effect is not caused in the memory cell 19. In contrast, a bootstrap effect is caused in the memory cell 11; thus, the read access time tRAC decreases by 33%. Accordingly, stepping up the voltage of the node SN by using a bootstrap effect is extremely effective in increasing the reading speed.

Figure 17A:
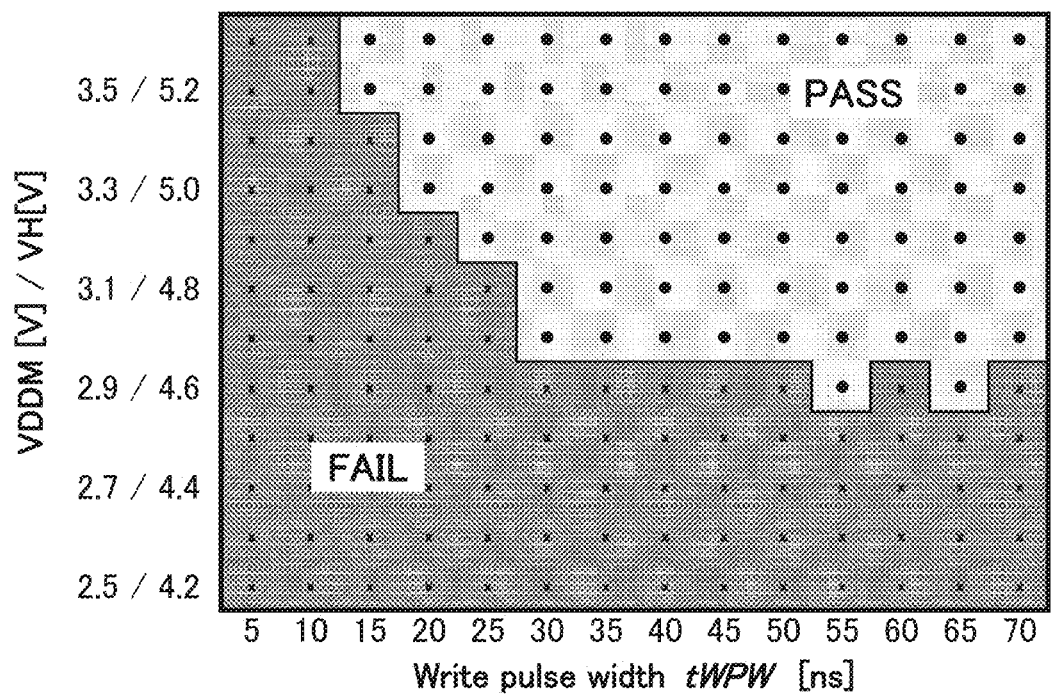
FIGS. 17A and 17B are shmoo plots of a memory device at room temperature (VDDM/VH vs. tWPW and VDDM/VH vs. tRAC).
Figure 17B:
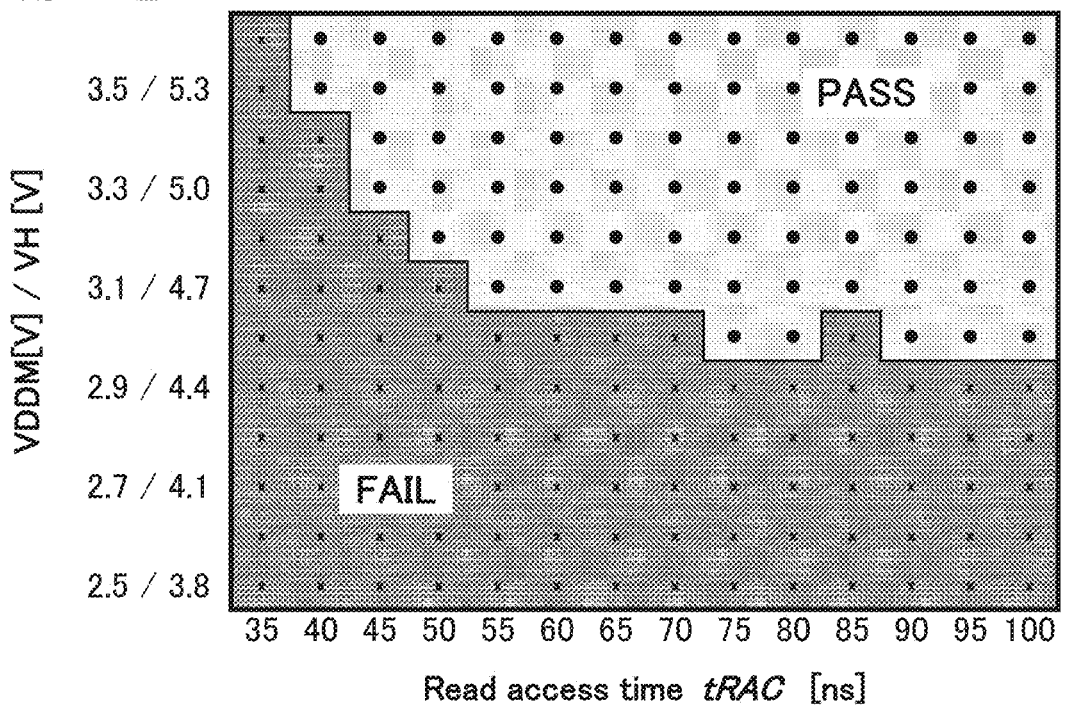

The memory device 100 was fabricated through a 60-nm OS transistor process. A channel formation region of the OS transistor was formed using a crystalline In—Ga—Zn oxide layer. FIGS. 17A and 17B are shmoo plots of the fabricated memory device 100 at room temperature (VDDM/VH vs. tWPW and VDDM/VH vs. tRAC). A voltage VH is the "H" voltage of a control signal (e.g., WE, RE, or PREP). The back gate voltages of the transistors M1, M2, and M3 in the memory cell 11 are respectively −7 V, 5 V, and 0 V. The back gate voltages of the transistors M51 and M52 in the circuit 25 are 5 V. When the voltage VDDM/VH was 3.3 V/5.0 V, the pulse width tWPW and the read access time tRAC were respectively 20 ns and 45 ns. In other words, the write time/read time was 20 ns/45 ns and the write energy/read energy was 97.9 pJ/58.6 pJ.

<Rewrite Endurance 1>

Figure 18A:
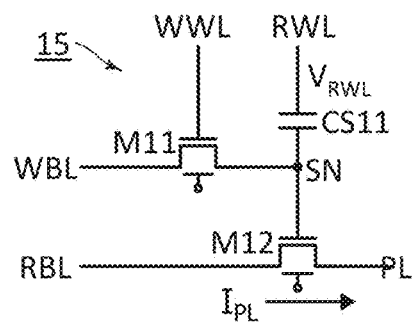
FIG. 18A is a circuit diagram of a test circuit.

A write/read (rewrite) cycle test where the ambient temperature was room temperature (27° C.) was conducted using a test circuit 15 that is a 2T1C gain cell. As illustrated in FIG. 18A, the test circuit 15 includes transistors M11 and M12, a capacitor CS11, the node SN, the write word line WWL, the read word line RWL, the write bit line WBL, the read bit line RBL, and the wiring PL. The transistor M11 is a write transistor and the transistor M12 is a read transistor. The transistors M11 and M12 are OS transistors with back gates, whose channel formation regions were formed using crystalline In—Ga—Zn oxide layers. The W/L of the transistor M11 is 500 nm/500 nm, and that of the transistor M12 is 60 nm/60 nm.

In the write/read cycle test, the back gate of the transistor M11 was fixed at −7 V and the back gate of the transistor M12 was in an electrically floating state. Voltages of 1.8 V and 0 V were respectively input to the read bit line RBL and the wiring PL. The pulse width tWPW in the write cycle and that in the read cycle were respectively 10 ns and 100 ns. The "H"/"L" of the write word line WWL was 3.3 V/0 V and the "H"/"L" of the write bit line WBL was 1.8 V/0 V.

Figure 18B:
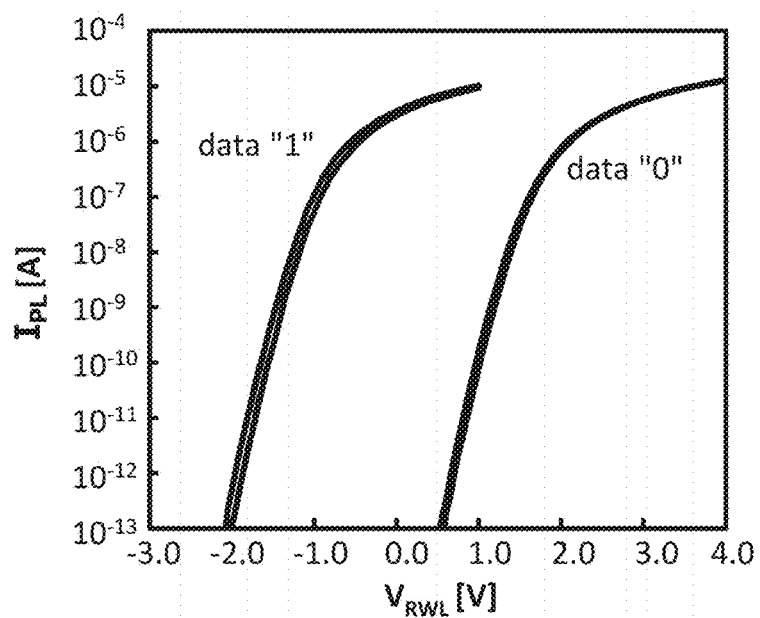
FIG. 18B shows measured current-voltage characteristics of a read transistor.
Figure 18C:
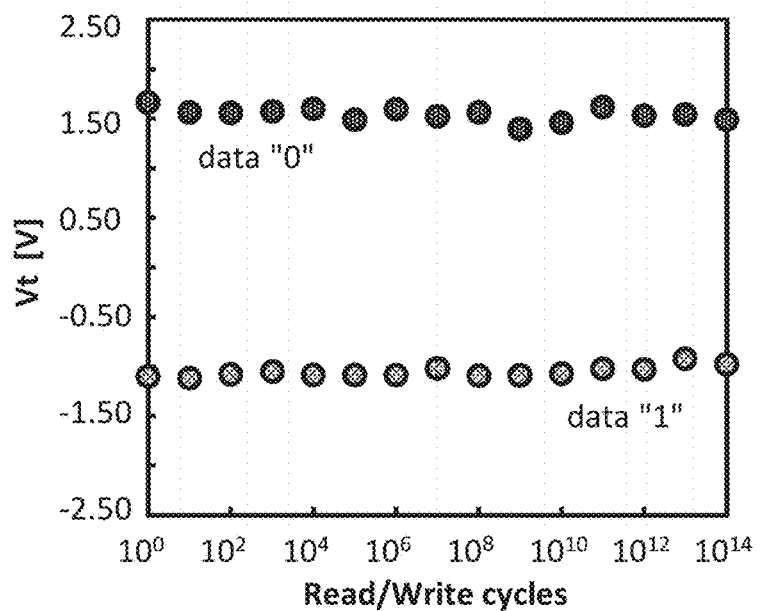
FIG. 18C shows calculated threshold voltages of the read transistor.

In the write cycle, the data "1" and the data "0" were alternately written in the node SN. The read cycle was performed every time the cumulative total number of the write cycles of the data "1" (or "0") reached $10^n$ (n is an integer from 0 to 14). In the read cycle, first, the data "1" or "0" was written in the node SN and then, data read operation was repeated and the $I_{PL}$-$V_{RWL}$ characteristics of the transistor M12 were measured. $I_{PL}$ indicates the current flowing through the wiring PL and $V_{RWL}$ indicates the voltage of the read word line RWL. The voltage $V_{RWL}$ was changed from −3.0 V to 1.0 V in increments of +0.05 V in the read cycle of the data "1" and was changed from 0 V to 4.0 V in increments of +0.05 V in the read cycle of the data "0". FIG. 18B shows $I_{PL}$-$V_{RWL}$ characteristics curves at the time when data "1"/"0" was retained in the node SN. By square root extrapolation, the Vt values of the transistor M12 were calculated from the obtained $I_{PL}$-$V_{RWL}$ characteristics curves. FIG. 18C shows the calculation results. The difference between the Vt at the time of retaining the data "1" and the Vt at the time of retaining the data "0" was approximately 2.5 V after $10^{14}$ write cycles. Thus, the two states were distinguished from each other with a sufficient margin even after $10^{14}$ write cycles.

These results of this write/read cycle test show that the memory device 100 using the test circuit 15 can endure $10^{14}$ cycles, which means high rewrite endurance.

<Rewrite Endurance 2>

Figure 19A:
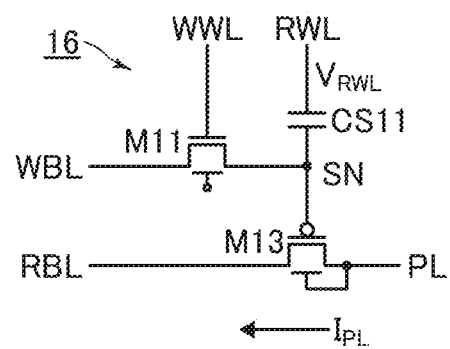
FIG. 19A is a circuit diagram of a test circuit and FIG. 19B shows calculated voltages $V_{SN}$.

A write/read (rewrite) cycle test where the ambient temperature was 85° C. was conducted using a test circuit 16 illustrated in FIG. 19A. Like the test circuit 15, the test circuit 16 is a 2T1C gain cell. The test circuit 16 is different from the test circuit 15 in that a transistor M13, which is a p-channel Si transistor (bulk transistor), is used instead of the transistor M12. Like the transistor M12, the transistor M13 functions as a read transistor.

In the write/read cycle test using the test circuit 16, the back gate of the transistor M11 was fixed at −3 V. Voltages of 0 V and 1.2 V were respectively input to the read bit line RBL and the wiring PL. The "H"/"L" of the write word line WWL was 2.5 V/−0.8 V and the "H"/"L" of the write bit line WBL was 1.2 V/0 V.

In a manner similar to that of the write/read cycle test using the test circuit 15, the data "1" and the data "0" were alternately written in the node SN in the write cycle.

The read cycle was performed every time the cumulative total number of the write cycles of the data "1" (or "0") reached $10^n$ (n is an integer from 0 to 14). In the write/read cycle test using the test circuit 16, $I_{PL}$ was measured at the time of the read cycle, and the voltage of the node SN, $V_{SN}$, was calculated from the $I_{PL}$ value.

Figure 19B:
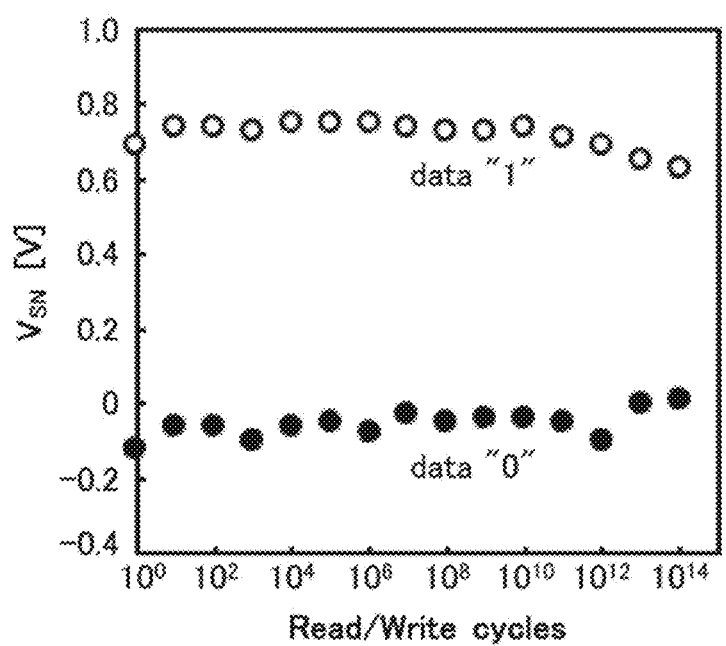

FIG. 19B shows the calculated $V_{SN}$. After $10^{14}$ write cycles, the $V_{SN}$ at the time of retaining the data "1" was 0.63 V and the $V_{SN}$ at the time of retaining the data "0" was 0.01 V. The difference between the $V_{SN}$ at the time of retaining the data "1" and the $V_{SN}$ at the time of retaining the data "0" was approximately 0.62 V. Thus, the two states were distinguished from each other even after $10^{14}$ write cycles.

These results of this write/read cycle test show that the memory device 100 using the test circuit 16 can endure $10^{14}$ cycles even at an ambient temperature of 85° C., which means high rewrite endurance.

<Specifications>

Figures 20A, 20B:
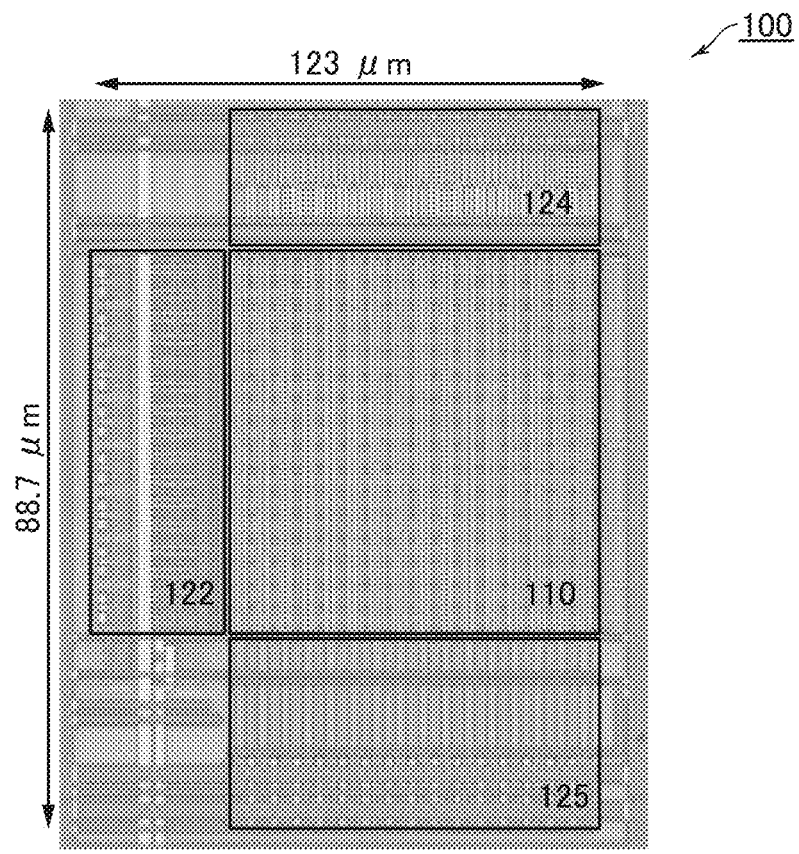
FIG. 20A is a micrograph of a memory device and FIG. 20B lists specifications of the memory device.

FIG. 20A shows a micrograph of the memory device 100 using the test circuit 15. Note that the output circuit 126 is not shown in FIG. 20A.

FIG. 20B shows the specifications of the memory device 100. The static power (standby power) of the memory device 100 in a standby state at room temperature is 9.9 nW, and the active power in write operation and that in read operation are respectively 97.9 μW/MHz and 258.6 μW/MHz. On the assumption that the load capacitance of the circuit 25 is 10 fF, the active power is calculated to be 123.6 W/MHz. From the above standby power and the calculated active power, the memory cell array 110 with an expanded memory capacity of 1 Mbit is estimated to have an active power of 133.7 μW/MHz. Accordingly, the memory device 100 has low power consumption.

SUMMARY

A 1 kbit OS memory device was fabricated through a 60-nm OS transistor process. The write time was 20 ns, the read time was 45 ns, and the OS memory device endured $10^{14}$ cycles, which means high rewrite endurance. It was found that the fabricated OS memory device had characteristics required for embedded memory devices, such as a high operating speed and low power consumption.

REFERENCE NUMERALS 11, 12, 19: memory cell; 15, 16: test circuit; 20, 22, 24, 25, 26: circuit; 26A: inverter circuit; 26B: output buffer circuit; 100: memory device; 110: memory cell array; 120: peripheral circuit; 122: row decoder; 124: write circuit; 125: read circuit; 126: output circuit; 130: decoder; 132: word line driver; 180: 4-stage shift register; 181_1, 181_2, 181_3, 181_4: shift register; 200: application processor (AP); 205: embedded memory device; 210: CPU; 211: bus; 213, 215: peripheral circuit; 217: input/output interface circuit; 221: CMOS transistor layer; 222: OS transistor layer; 224: control circuit; 230: arithmetic processing device; 233: processing engine (PE); 235: embedded memory device; 236: memory cell array; 237: peripheral circuit; 239: external memory device; 5001, 5003: OS transistor; 5010, 5011, 5012, 5013: metal oxide layer; 5021, 5022, 5023, 5024, 5025, 5026, 5027, 5028, 5029, 5030, 5031: insulating layer; 5050, 5051, 5052, 5053, 5054: conductive layer; 7010: processor chip; 7100: robot; 7120: flying object; 7140:

cleaning robot; 7160: automobile; 7200: television receiving (TV) device; 7210: smartphone; 7220: personal computer (PC); 7230: personal computer (PC); 7232: keyboard; 7233: monitor device; 7240: game console; 7260: game console; 7262: controller; A0, A1, A3, A4, A5, A6, B5, B6, N6, SN, X0, X1, Y1, Y2, Y3, Y4, Y5: node; CO1, CO2, CS1, CS5, CS11: capacitor; M1, M2, M3, M5, M6, M7, M11, M12, M19, M20, M21, M23, M24, M25, M26, M27, M28, M41, M42, M43, M44, M51, M52, M53, M54, M60, M61, M62, M63, M64, M65, M66, M67, M81, M82, M83, M84, M85, M86: transistor; BGL1, BGL2, BGL3, PL: wiring; RBL: read bit line; RWL: read word line; WBL: write bit line; and WWL: write word line.

This application is based on Japanese Patent Application Serial No. 2017-225312 filed with Japan Patent Office on Nov. 24, 2017 and Japanese Patent Application Serial No. 2018-169677 filed with Japan Patent Office on Sep. 11, 2018, the entire contents of which are hereby incorporated by reference.

The invention claimed is:

1. A semiconductor device comprising:
   a write word line;
   a read word line;
   a write bit line;
   a read bit line;
   a first wiring; and
   a memory cell including a retention node, a first transistor, a second transistor, a third transistor, and a capacitor,
   wherein a channel formation region of each of the first transistor, the second transistor, and the third transistor comprises a metal oxide layer,
   wherein a gate of the first transistor, a gate of the second transistor, and a gate of the third transistor are electrically connected to the write word line, the retention node, and the read word line, respectively,
   wherein one of a source and a drain of the first transistor is electrically connected to the write bit line,
   wherein the other of the source and the drain of the first transistor is electrically connected to the retention node and a first terminal of the capacitor,
   wherein the second transistor and the third transistor are electrically connected in series between the read bit line and the first wiring, and
   wherein a second terminal of the capacitor is electrically connected to the read bit line.

2. The semiconductor device according to claim 1,
   wherein the first transistor, the second transistor, and the third transistor each comprise a back gate,
   wherein a first voltage, a second voltage, and a third voltage are input to the back gate of the first transistor, the back gate of the second transistor, and the back gate of the third transistor, respectively, and
   wherein the second voltage is higher than the first voltage and the third voltage.

3. The semiconductor device according to claim 2, wherein the first voltage is lower than the second voltage and the third voltage.

4. The semiconductor device according to claim 1, further comprising a first dynamic logic circuit,
   wherein the first dynamic logic circuit comprises a first dynamic node, a fourth transistor, a fifth transistor, a sixth transistor, and a seventh transistor,
   wherein a channel formation region of each of the fourth transistor, the fifth transistor, the sixth transistor, and the seventh transistor comprises a metal oxide layer,
   wherein a first signal is input to a gate of the fourth transistor,
   wherein a fourth voltage is input to one of a source and a drain of the fourth transistor,
   wherein the other of the source and the drain of the fourth transistor is electrically connected to the read bit line,
   wherein the fifth transistor, the sixth transistor, and the seventh transistor are electrically connected in series,
   wherein a gate of the sixth transistor is electrically connected to the read bit line,
   wherein a second signal is input to a gate of the fifth transistor, and
   wherein an inverted signal of the second signal is input to a gate of the seventh transistor.

5. The semiconductor device according to claim 4,
   wherein the fourth transistor, the fifth transistor, the sixth transistor, and the seventh transistor each comprise a back gate,
   wherein in each of the fourth transistor and the seventh transistor, the back gate is electrically connected to the gate, and
   wherein the fourth voltage and a fifth voltage are input to the back gate of the fifth transistor and the back gate of the sixth transistor, respectively.

6. The semiconductor device according to claim 1, further comprising a second dynamic logic circuit,
   wherein the second dynamic logic circuit comprises a first input node, an eighth transistor, a ninth transistor, a tenth transistor, an eleventh transistor, a twelfth transistor, and a thirteenth transistor,
   wherein a channel formation region of each of the eighth transistor, the ninth transistor, the tenth transistor, the eleventh transistor, the twelfth transistor, and the thirteenth transistor comprises a metal oxide layer,
   wherein a third signal is input to gates of the eighth transistor and the thirteenth transistor,
   wherein one of a source and a drain of the eighth transistor is electrically connected to the first input node,
   wherein one of a source and a drain of the eleventh transistor is electrically connected to the first input node,
   wherein the other of the source and the drain of the eighth transistor and drains of the ninth transistor and the tenth transistor are electrically connected to the read word line,
   wherein a fourth signal is input to gates of the tenth transistor and the eleventh transistor,
   wherein the other of the source and the drain of the eleventh transistor and drains of the twelfth transistor and the thirteenth transistor are electrically connected to the write word line,
   wherein a sixth voltage is input to sources of the ninth transistor, the tenth transistor, the twelfth transistor, and the thirteenth transistor, and
   wherein a fifth signal is input to gates of the ninth transistor and the twelfth transistor.

7. The semiconductor device according to claim 6,
   wherein the eighth transistor, the ninth transistor, the tenth transistor, the eleventh transistor, the twelfth transistor, and the thirteenth transistor each comprise a back gate, and
   wherein in each of the eighth transistor, the ninth transistor, the tenth transistor, the eleventh transistor, the twelfth transistor, and the thirteenth transistor, the back gate is electrically connected to the gate.

8. The semiconductor device according to claim 1, further comprising a third dynamic logic circuit,
- wherein the third dynamic logic circuit comprises a second input node, a fourteenth transistor, a fifteenth transistor, a sixteenth transistor, and a seventeenth transistor,
- wherein the fourteenth transistor, the fifteenth transistor, the sixteenth transistor, and the seventeenth transistor are electrically connected in series,
- wherein a channel formation region of each of the fourteenth transistor, the fifteenth transistor, the sixteenth transistor, and the seventeenth transistor comprises a metal oxide layer,
- wherein a fifth signal is input to a gate of the fourteenth transistor,
- wherein a gate of the fifteenth transistor is electrically connected to the second input node,
- wherein a connection node between the fourteenth transistor and the fifteenth transistor is electrically connected to the write bit line,
- wherein an inverted signal of the fifth signal is input to a gate of the sixteenth transistor, and
- wherein a third signal is input to a gate of the seventeenth transistor.

9. The semiconductor device according to claim 8,
- wherein the fourteenth transistor, the fifteenth transistor, the sixteenth transistor, and the seventeenth transistor each comprise a back gate, and
- wherein in each of the fourteenth transistor, the fifteenth transistor, the sixteenth transistor, and the seventeenth transistor, the back gate is electrically connected to the gate.

10. A semiconductor device comprising:
a write word line;
a read word line;
a write bit line;
a read bit line;
a first wiring; and
a memory cell including a retention node, a first transistor, a second transistor, a third transistor, and a capacitor,
- wherein a channel formation region of each of the first transistor, the second transistor, and the third transistor comprises a metal oxide layer,
- wherein a gate of the first transistor, a gate of the second transistor, and a gate of the third transistor are electrically connected to the write word line, the retention node, and the read word line, respectively,
- wherein one of a source and a drain of the first transistor is electrically connected to the write bit line,
- wherein the other of the source and the drain of the first transistor is electrically connected to the retention node and a first terminal of the capacitor,
- wherein the second transistor and the third transistor are electrically connected in series between the read bit line and the first wiring, and
- wherein a second terminal of the capacitor is electrically connected to a connection node between the second transistor and the third transistor.

11. The semiconductor device according to claim 10,
- wherein the first transistor, the second transistor, and the third transistor each comprise a back gate,
- wherein a first voltage, a second voltage, and a third voltage are input to the back gate of the first transistor, the back gate of the second transistor, and the back gate of the third transistor, respectively, and
- wherein the second voltage is higher than the first voltage and the third voltage.

12. The semiconductor device according to claim 11, wherein the first voltage is lower than the second voltage and the third voltage.

13. The semiconductor device according to claim 10, further comprising a first dynamic logic circuit,
- wherein the first dynamic logic circuit comprises a first dynamic node, a fourth transistor, a fifth transistor, a sixth transistor, and a seventh transistor,
- wherein a channel formation region of each of the fourth transistor, the fifth transistor, the sixth transistor, and the seventh transistor comprises a metal oxide layer,
- wherein a first signal is input to a gate of the fourth transistor,
- wherein a fourth voltage is input to one of a source and a drain of the fourth transistor,
- wherein the other of the source and the drain of the fourth transistor is electrically connected to the read bit line,
- wherein the fifth transistor, the sixth transistor, and the seventh transistor are electrically connected in series,
- wherein a gate of the sixth transistor is electrically connected to the read bit line,
- wherein a second signal is input to a gate of the fifth transistor, and
- wherein an inverted signal of the second signal is input to a gate of the seventh transistor.

14. The semiconductor device according to claim 13,
- wherein the fourth transistor, the fifth transistor, the sixth transistor, and the seventh transistor each comprise a back gate,
- wherein in each of the fourth transistor and the seventh transistor, the back gate is electrically connected to the gate, and
- wherein the fourth voltage and a fifth voltage are input to the back gate of the fifth transistor and the back gate of the sixth transistor, respectively.

15. The semiconductor device according to claim 10, further comprising a second dynamic logic circuit,
- wherein the second dynamic logic circuit comprises a first input node, an eighth transistor, a ninth transistor, a tenth transistor, an eleventh transistor, a twelfth transistor, and a thirteenth transistor,
- wherein a channel formation region of each of the eighth transistor, the ninth transistor, the tenth transistor, the eleventh transistor, the twelfth transistor, and the thirteenth transistor comprises a metal oxide layer,
- wherein a third signal is input to gates of the eighth transistor and the thirteenth transistor,
- wherein one of a source and a drain of the eighth transistor is electrically connected to the first input node,
- wherein one of a source and a drain of the eleventh transistor is electrically connected to the first input node,
- wherein the other of the source and the drain of the eighth transistor and drains of the ninth transistor and the tenth transistor are electrically connected to the read word line,
- wherein a fourth signal is input to gates of the tenth transistor and the eleventh transistor,
- wherein the other of the source and the drain of the eleventh transistor and drains of the twelfth transistor and the thirteenth transistor are electrically connected to the write word line,
- wherein a sixth voltage is input to sources of the ninth transistor, the tenth transistor, the twelfth transistor, and the thirteenth transistor, and
- wherein a fifth signal is input to gates of the ninth transistor and the twelfth transistor.

16. The semiconductor device according to claim 15,
wherein the eighth transistor, the ninth transistor, the tenth transistor, the eleventh transistor, the twelfth transistor, and the thirteenth transistor each comprise a back gate, and
wherein in each of the eighth transistor, the ninth transistor, the tenth transistor, the eleventh transistor, the twelfth transistor, and the thirteenth transistor, the back gate is electrically connected to the gate.

17. The semiconductor device according to claim 10, further comprising a third dynamic logic circuit,
wherein the third dynamic logic circuit comprises a second input node, a fourteenth transistor, a fifteenth transistor, a sixteenth transistor, and a seventeenth transistor,
wherein the fourteenth transistor, the fifteenth transistor, the sixteenth transistor, and the seventeenth transistor are electrically connected in series,
wherein a channel formation region of each of the fourteenth transistor, the fifteenth transistor, the sixteenth transistor, and the seventeenth transistor comprises a metal oxide layer,
wherein a fifth signal is input to a gate of the fourteenth transistor,
wherein a gate of the fifteenth transistor is electrically connected to the second input node,
wherein a connection node between the fourteenth transistor and the fifteenth transistor is electrically connected to the write bit line,
wherein an inverted signal of the fifth signal is input to a gate of the sixteenth transistor, and
wherein a third signal is input to a gate of the seventeenth transistor.

18. The semiconductor device according to claim 17,
wherein the fourteenth transistor, the fifteenth transistor, the sixteenth transistor, and the seventeenth transistor each comprise a back gate, and
wherein in each of the fourteenth transistor, the fifteenth transistor, the sixteenth transistor, and the seventeenth transistor, the back gate is electrically connected to the gate.

19. A dynamic logic circuit comprising:
an input node;
a first wiring, a second wiring, a third wiring, and a fourth wiring; and
a first transistor, a second transistor, a third transistor, and a fourth transistor of a single conductivity type,
wherein a first signal is input to a gate of the first transistor,
wherein a source and a drain of the first transistor are electrically connected to the first wiring and the input node, respectively,
wherein the second transistor, the third transistor, and the fourth transistor are electrically connected in series between the second wiring and the third wiring,
wherein a second signal is input to a gate of the second transistor,
wherein an inverted signal of the second signal is input to a gate of the fourth transistor,
wherein a gate of the third transistor is electrically connected to the input node,
wherein the third transistor comprises a back gate, and
wherein the back gate is electrically connected to the fourth wiring.

20. The dynamic logic circuit according to claim 19, further comprising a fifth wiring,
wherein the second transistor comprises a back gate, and
wherein the back gate is electrically connected to the fifth wiring.

21. A dynamic logic circuit comprising:
an input node;
a first dynamic node and a second dynamic node; and
a first transistor, a second transistor, a third transistor, a fourth transistor, a fifth transistor, and a sixth transistor of a single conductivity type,
wherein drains of the first transistor, the second transistor, and the third transistor are electrically connected to the first dynamic node,
wherein drains of the fourth transistor, the fifth transistor, and the sixth transistor are electrically connected to the second dynamic node,
wherein sources of the first transistor and the fourth transistor are electrically connected to the input node,
wherein a first voltage is input to sources of the second transistor, the third transistor, the fifth transistor, and the sixth transistor,
wherein a first signal is input to gates of the first transistor and the sixth transistor,
wherein a second signal is input to gates of the fourth transistor and the third transistor, and
wherein a third signal is input to gates of the second transistor and the fifth transistor.

22. The dynamic logic circuit according to claim 21,
wherein the first transistor, the second transistor, the third transistor, the fourth transistor, the fifth transistor, and the sixth transistor each comprise a back gate, and
wherein in each of the first transistor, the second transistor, the third transistor, the fourth transistor, the fifth transistor, and the sixth transistor, the back gate is electrically connected to the gate.

* * * * *